United States Patent
Kilian et al.

(10) Patent No.: US 11,588,580 B2
(45) Date of Patent: Feb. 21, 2023

(54) INTERLEAVER FOR INTERLEAVING LDPC ENCODED BIT SEQUENCE

(71) Applicants: Fraunhofer-Gesellschaft zur Förderung der angewandten Forschung e.V., Munich (DE); Friedrich-Alexander-Universitaet Erlangen-Nuernberg, Erlangen (DE)

(72) Inventors: Gerd Kilian, Erlangen (DE); Sally Nafie, Erlangen (DE); Jörg Robert, Erlangen (DE); Jakob Kneißl, Erlangen (DE)

(73) Assignee: FRAUNHOFER-GESELLSCHAFT ZUR F RDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

(21) Appl. No.: 17/363,673

(22) Filed: Jun. 30, 2021

(65) Prior Publication Data

US 2022/0149989 A1    May 12, 2022

Related U.S. Application Data

(63) Continuation of application No. PCT/EP2020/050283, filed on Jan. 8, 2020.

(30) Foreign Application Priority Data

Jan. 10, 2019 (DE) .......................... 102019200256.0

(51) Int. Cl.
*H03M 13/00* (2006.01)
*H04L 1/00* (2006.01)
(Continued)

(52) U.S. Cl.
CPC ....... *H04L 1/0071* (2013.01); *H03M 13/1111* (2013.01); *H03M 13/2792* (2013.01); *H03M 13/2906* (2013.01); *H04L 1/0057* (2013.01)

(58) Field of Classification Search
CPC .......... H03M 13/1111; H03M 13/2778; H03M 13/2792; H03M 13/2906; H04L 1/0057; H04L 1/0071
See application file for complete search history.

(56) References Cited

U.S. PATENT DOCUMENTS

| | | | |
|---|---|---|---|
| 2007/0290908 A1* | 12/2007 | Esumi ..................... | G11B 20/10 360/39 |
| 2009/0070602 A1* | 3/2009 | Ingle ..................... | G06F 9/3851 713/300 |

(Continued)

FOREIGN PATENT DOCUMENTS

| | | |
|---|---|---|
| CN | 106416084 A | 2/2017 |
| DE | 102018206132 A1 | 10/2019 |

(Continued)

OTHER PUBLICATIONS

Lan/Man Standards Committee of the IEEE Computer Society, "P802.15.4w (TM) / D1.1 Draft Standard for Amendment for a Low Power Wide Area Network (LPWAN) extension to the LECIM Physical layer (PHY)", IEEE Draft; IEEE-SA, Piscataway, NJ USA, vol. 802.15.4w drafts, No. D1.1, May 15, 2019, pp. 1-49, XP068150356.

(Continued)

*Primary Examiner* — Albert Decady
*Assistant Examiner* — Enamul M Kabir
(74) *Attorney, Agent, or Firm* — Novick, Kim & Lee PLLC; Jae Youn Kim

(57) ABSTRACT

Embodiments provide an interleaver for interleaving an LDPC encoded bit sequence, wherein the interleaver includes a segmentation stage configured to segment the LDPC encoded bit sequence into a plurality of chunks (Continued)

including a first chunk and one or more other chunks, a first interleaver stage, configured to interleave the one or more other chunks or a concatenated version thereof, a second interleaver stage, configured to block wise interleave the first chunk and an interleaved bit sequence provided by the first interleaver stage, to obtain an interleaved version of the LDPC encoded bit sequence, wherein the first chunk consists of bits of a first type being, which are error correcting bits or repeat accumulate bits of the LDPC encoded bit sequence, or are represented, in a Tanner graph representation of the LDPC encoded bit sequence, by variable nodes that include non-random connections to at least two error correcting check nodes.

31 Claims, 17 Drawing Sheets

(51) Int. Cl.
    *H03M 13/11*     (2006.01)
    *H03M 13/27*     (2006.01)
    *H03M 13/29*     (2006.01)

(56) References Cited

U.S. PATENT DOCUMENTS

| | | | |
|---|---|---|---|
| 2013/0080844 A1* | 3/2013 | Xu | H03M 13/271 |
| | | | 711/E12.001 |
| 2013/0139023 A1* | 5/2013 | Han | G11B 20/1866 |
| | | | 714/752 |
| 2016/0285477 A1* | 9/2016 | Petrov | H04L 1/0041 |
| 2017/0170847 A1* | 6/2017 | Petrov | H03M 13/255 |
| 2018/0019900 A1* | 1/2018 | Sun | H04L 1/0071 |
| 2018/0302107 A1 | 10/2018 | Ikegaya et al. | |
| 2019/0327022 A1 | 10/2019 | Jeong et al. | |
| 2021/0083906 A1 | 3/2021 | Josef et al. | |

FOREIGN PATENT DOCUMENTS

| | | |
|---|---|---|
| EP | 2525498 A1 | 11/2012 |
| EP | 2566057 A1 | 3/2013 |
| WO | 2018/017225 A1 | 10/2019 |

OTHER PUBLICATIONS

S. Kobayashi et al., "Proposal of LDPC (Low Density Parity Code for LPWA", Project: IEEE P802.15 Working Group for Wireless Personal Area Networks (WPANs), doc.: IEEE 802.15-18-0289-01-004w, 2018.

R.D. Maddock et al., "Reliability-based coded modulation with low-density parity-check codes", IEEE Transactions on Communications, IEEE Service Center, Piscataway, NJ. USA, vol. 54, No. 3, Mar. 1, 2006, XP002507532.

* cited by examiner

INTERLEAVER FOR INTERLEAVING LDPC ENCODED BIT SEQUENCE

CROSS-REFERENCES TO RELATED APPLICATIONS

This application is a continuation of copending International Application No. PCT/EP2020/050283, filed Jan. 8, 2020, which is incorporated herein by reference in its entirety, and additionally claims priority from German Application No. DE 10 2019 200 256.0, filed Jan. 10, 2019, which is incorporated herein by reference in its entirety.

Embodiments relate to an interleaver, and more specifically, to an interleaver for an LDPC (LDPC=low-density parity-check code) encoded codeword. Further embodiments relate to a hybrid block-wise—random interleaver for iterative decision directed channel estimation of LDPC codewords with staircase node distribution.

BACKGROUND OF THE INVENTION

Low-Density Parity-Check Codes (LDPC), are considered as a breakthrough in the field of digital communications due to their spectacular performance and relatively low complexity. Their capacity approaching performance makes them appealing to a multitude of applications that necessitate robustness and reliability. Moreover, their sparse nature facilitates the Belief Propagation (BP) decoding on the Tanner graphs.

A starting point of an LDPC decoder involves the calculation of the apriori Log Likelihood Ratios (LLRs). For that purpose, the channel fading coefficients should be estimated by means of a known preamble sequence, and fed to the LDPC decoder. However, the preamble is only capable of providing short-term information about the fading channel. This means that, only the first neighboring coefficients can be estimated. As a result, the remaining symbols would have no Channel State Information (CSI). In other words, the LDPC decoder would be able to calculate the apriori LLRs of the first few symbols, while the remaining symbols would be treated as erasures. These erasures render the triggering of the BP decoding of LDPC impossible.

On the one hand, increasing the number of pilot symbols would result in a longer span of channel estimation. Consequently, more fading coefficients could be estimated and provided to the LDPC decoder, which leads to better performance. On the other hand, this enhanced performance would come at the price of reduced effective data rate due to the transmission of more non-data pilot symbols.

LDPC codes can be described by their Tanner graph. An (n, k) LDPC code has n variable nodes representing the n encoded bits, and n−k check nodes representing the parity check equations. A systematic LDPC code would have its k information bits mapped to the first k variable nodes.

The remaining n−k variable nodes resemble the n−k parity bits. The connections between the variable nodes and the check nodes are done according to the parity check matrix of the given LDPC code.

A class of LDPC codes such as the codes proposed for the upcoming IEEE 802.15.4w [1], and the codes adopted in the DVB-NGH standard, is featured with a staircase node distribution. This means that, except for the first k variable nodes representing the systematic information part, the connections of the variable nodes and the check nodes follow a staircase fashion. In other words, each variable node is connected to two consecutive check nodes. The $(k+1)^{th}$ variable node is connected to the first and second check nodes. The $(k+2)^{th}$ variable node is connected to the second and third check nodes, and so on. The $n^{th}$ variable node is connected to the $(n-k)^{th}$ check node.

FIG. 1 shows a Tanner graph 10 example of an (736,184) LDPC code proposed in [3], with code rate, r=1/4. It has n=736 variable nodes 12, and n−k=552 check nodes 14. The first k variable nodes 12 correspond to the systematic information part. Their node degree goes up to d=10, and they have random connections 16 to the check nodes 14. Except for the last variable node, the remaining 551 variable nodes exhibit a staircase connection to the corresponding check nodes 14, and are of degree, d=2.

An LDPC code with a staircase node distribution is vulnerable to decoding failure when the channel estimator provides CSI about few symbols. The reason behind this performance deterioration comes from the connection pattern of the check nodes to the corresponding variable nodes. For example, for the (736,184) code, except for the first check node, each one is of degree d=4. Every check node is connected at random to two variable nodes from the first k variable nodes. The remaining two edges follow the staircase structure via the consecutive variable node connections. This means that, a short preamble sequence would only provide information about the first few bits of the systematic part. This leaves all the check nodes of the Tanner graph with at least two erased LLRs received from their corresponding variable nodes. Consequently, the BP decoding algorithm would fail to start.

Therefore, it is the object of the present invention to provide a concept that allows the viability of the Belief Propagation (BP) decoding algorithm of LDPC even with a limited number of estimated fading coefficients.

SUMMARY

According to an embodiment, an interleaver for interleaving an LDPC encoded bit sequence may have: a segmentation stage configured to segment the LDPC encoded bit sequence into a plurality of chunks, the plurality of chunks including a first chunk and one or more other chunks, a first interleaver stage, configured to interleave the one or more other chunks or a concatenated version thereof, a second interleaver stage, configured to block wise interleave the first chunk of the plurality of chunks and an interleaved bit sequence provided by the first interleaver stage, to acquire an interleaved version of the LDPC encoded bit sequence, wherein the first chunk of the plurality of chunks includes bits of a first type, wherein the bits of the first type: are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes.

Another embodiment may have an interleaver for interleaving an LDPC encoded bit sequence, wherein the interleaver is configured to interleave the LDPC encoded bit sequence, to acquire an interleaved version of the LDPC encoded bit sequence based on the following syntax:

```
Input: v, r, n, N_hops, N_bits/round^(1), π
N_chunks = 1/r
N_bits/chunk = n/N_chunks
N_bits/hop = n/N_hops
N_rounds^(1) = n/(N_chunks × N_hops × N_bits/round^(1))
N_bits/chunk/hop = N_bits/chunk/N_hops
N_bits/round^(0→N_chunks−1\1) = (N_chunks − 1) × N_bits/chunk/hop
%_____Segmentation_____%
for i = 0: N_chunks − 1
    for j = 0: N_bits/chunk − 1
        Ch_i(j) = v(j + iN_bits/chunk)
    end
end
%_____Concatenation_____%
k = 0
for i = 0: N_chunks − 1
    if
        continue
    end
    for j = 0: N_bits/chunk − 1
        Ch_0→N_chunks−1\1(j + kN_bits/chunk) = Ch_i(j)
    end
    k = k + 1
end
%_____Random Interleaver_____%
for j = 0: ((N_chunks − 1)N_bits/chunk) − 1
    C̃h_0→N_chunks−1\1(j) = Ch_0→N_chunks−1\1(π(j))
end
%_____Block Interleaver_____%
for i = 0: N_hops − 1
    for j = 0: N_bits/round^(1) − 1
        for k = 0: N_rounds^(1) − 1
            ṽ(j + iN_bits/hop + kN_bits/round^(1)) = Ch_1(j + iN_bits/round^(1) + kN_hopsN_bits/round^(1))
        end
    end
    for j = 0: N_bits/round^(0→N_chunks−1\1) − 1
        ṽ(j + iN_bits/hop + N_bits/chunk/hop) = C̃h_0→N_chunks−1\1 (j + iN_bits/round^(0→N_chunks−1\1))
    end
end
Output: ṽ
``` wherein i represents a control variable,
wherein j represents a control variable,
wherein n represents a number of bits of the LDPC encoded bit sequence,
wherein k represents a control variable,
wherein r represents the code rate,
wherein $N_{chunks}$ represents a number of chunks the LDPC encoded bit sequence is segmented into,
wherein $N_{hops}$ represents a number of sub-data packets over which the interleaved version of the LDPC encoded bit sequence is distributed,
wherein $N_{rounds}^{(1)}$ represents a number of rounds that may be used to distribute the bits of the first chunk,
wherein $N_{bits/round}^{(1)}$ represents a number of bits per round which are taken from the first chunk and are distributed over the plurality of sub-data packets,
wherein $N_{bits/round}^{(0 \to N_{chunks}-1 \backslash 1)}$ represents a number of bits per round which are taken from the other chunks and are distributed over the plurality of sub-data packets,
wherein $N_{bits/hop}$ represents a number of bits per sub-data packet,
wherein $N_{bits/chunk}$ represents a number of bits per chunk,
wherein $N_{bits/chunk/hop}$ represents a number of bits per chunk per hop,
wherein v represents the LDPC encoded bit sequence,
wherein ṽ represents the interleaved version of the LDPC encoded bit sequence,
wherein $Ch_i$ represent each of the plurality of chunks,
wherein $Ch_1$ represents the first chunk, wherein $$\widetilde{Ch}_{0 \to N_{chunks}-1 \backslash 1}$$

represents the interleaved bit sequence.

Another embodiment may have an interleaver for interleaving an LDPC encoded codeword, the LDPC encoded codeword including a bit sequence of 736 FEC encoded bits, the interleaver including: a segmentation stage configured to segment the bit sequence z of 736 FEC encoded bits into four equally sized chunks, the four chunks including a chunk number one, a chunk number two, a chunk number three and a chunk number four, a first interleaver stage configured to pseudo randomly scramble a sequence y of bits including the chunk number one, the chunk number three and the chunk number four, to acquire a scrambled version y' of the sequence of bits, wherein the sequence y is pseudo randomly scrambled using a scramble vector u, which is derived from a pseudo random sequence v, generated by a 10-bit Galois LFSR with generator polynomial $g(x)=x^{10}+x^7+1$, a second interleaver stage configured to distribute the chunk number two over L radio-bursts by assigning every bit $c_n$ of the chunk number two, a radio-burst index l and a position i within the radio-burst dependent on the index n based on the following syntax:

$$l(n) = \left\lfloor \frac{n}{2} \right\rfloor \mod 23,$$

$$i(n) = 2 \cdot \left\lfloor \frac{n}{46} \right\rfloor +,$$

with $n \in \{0,1,2 \ldots 183\}$, where $n=0$ refers to the first bit $c_0$ of the chunk number two, wherein the second interleaver stage is configured to distribute the scrambled version y' of the sequence of bits over the L radio-bursts by assigning a radio-burst index l and a position i dependent on the index m based on the following syntax:

$$l(m) = \left\lfloor \frac{m}{24} \right\rfloor,$$

$$i(m) = 8 + (m \mod 24),$$

with $m \in \{0,1,2 \ldots 551\}$, where $m=0$ refers to the first bit $y'_0$ of the scrambled version y' of the sequence of bits.

Another embodiment may have a transmitter including: an inventive interleaver, an LDPC encoder configured to provide the LDPC encoded bit sequence, and a transmitting unit configured to transmit the interleaved version of the LDPC encoded bit sequence using a plurality of sub-data packets, wherein the plurality of sub-data packets are transmitted non-concurrently.

Another embodiment may have a de-interleaver for de-interleaving an interleaved version of an LDPC encoded bit sequence, wherein the de-interleaver includes: a first de-interleaver stage, configured to block wise de-interleave the interleaved version of the LDPC encoded bit sequence, to acquire a first chunk and an interleaved bit sequence, a second de-interleaver stage, configured to de-interleave the interleaved bit sequence, to acquire the one or more other chunks, a concatenation stage, configured to concatenate the first chunk and the one or more other chunks, to acquire the LDPC encoded bit sequence, wherein the first chunk of the plurality of chunks includes bits of a first type, wherein the bits of the first type: are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes.

According to another embodiment, a receiver may have: a receiving unit, configured to receive a plurality of sub-data packets that are transmitted non-concurrently from a transmitter to the receiver, an inventive de-interleaver, wherein the de-interleaver is configured to iteratively de-interleave, using channel state information describing a channel between the transmitter and the receiver, a faded version of the LDPC encoded bit sequence transmitted with the plurality of sub-data packets, and an iterative decoder, configured to iteratively decode the LDPC encoded bit sequence iteratively provided by the de-interleaver, wherein the channel state information is iteratively updated based on a decoded bit sequence provided by the iterative decoder.

According to another embodiment, a method for interleaving an LDPC encoded bit sequence may have the steps of: segmenting the LDPC encoded bit sequence into a plurality of chunks, the plurality of chunks including a first chunk and one or more other chunks, interleaving the one or more other chunks or a concatenated version thereof, to acquire an interleaved bit sequence, block wise interleaving the first chunk of the plurality of chunks and the interleaved bit sequence, to acquire an interleaved version of the LDPC encoded bit sequence, wherein the first chunk of the plurality of chunks includes bits of a first type, wherein the bits of the first type: are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes.

According to another embodiment, a method for interleaving an LDPC encoded codeword, the LDPC encoded codeword including a bit sequence of 736 FEC encoded bits, may have the steps of: segmenting the bit sequence z of 736 FEC encoded bits into four equally sized chunks, the four chunks including a chunk number one, a chunk number two, a chunk number three and a chunk number four, pseudo randomly scrambling a sequence y of bits including the chunk number one, the chunk number three and the chunk number four, to acquire a scrambled version y' of the sequence of bits, wherein the sequence y is pseudo randomly scrambled using a scramble vector u, which is derived from a pseudo random sequence v, generated by a 10-bit Galois LFSR with generator polynomial $g(x)=x^{10}+x^7+1$, distributing the chunk number two over L radio-bursts by assigning every bit $c_n$ of the chunk number two, a radio-burst index l and a position i within the radio-burst dependent on the index n based on the following syntax:

$$l(n) = \left\lfloor \frac{n}{2} \right\rfloor \mod 23,$$

$$i(n) = 2 \cdot \left\lfloor \frac{n}{46} \right\rfloor +,$$

with $n \in \{0,1,2 \ldots 183\}$, where $n=0$ refers to the first bit $c_0$ of the chunk number two, distributing the scrambled version y' of the sequence of bits over the L radio-bursts by assigning a radio-burst index l and a position i dependent on the index m based on the following syntax:

$$l(m) = \left\lfloor \frac{m}{24} \right\rfloor,$$

$$i(m) = 8 + (m \mod 24),$$

with $m \in \{0,1,2 \ldots 551\}$, where $m=0$ refers to the first bit $y'_0$ of the scrambled version y' of the sequence of bits.

According to another embodiment, a method for de-interleaving an interleaved version of an LDPC encoded bit sequence may have the steps of: block wise de-interleaving the interleaved version of the LDPC encoded bit sequence, to acquire a first chunk and an interleaved version of one or more other chunks, de-interleaving the interleaved version of the one or more other chunks, to acquire the one or more other chunks, concatenating the first chunk and the one or more other chunks, to acquire the LDPC encoded bit sequence, wherein the first chunk of the plurality of chunks includes bits of the first type: are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes.

Another embodiment may have a non-transitory digital storage medium having a computer program stored thereon to perform the method for interleaving an LDPC encoded bit sequence, the method having the steps of: segmenting the LDPC encoded bit sequence into a plurality of chunks, the plurality of chunks including a first chunk and one or more other chunks, interleaving the one or more other chunks or a concatenated version thereof, to acquire an interleaved bit sequence, block wise interleaving the first chunk of the plurality of chunks and the interleaved bit sequence, to acquire an interleaved version of the LDPC encoded bit sequence, wherein the first chunk of the plurality of chunks includes bits of a first type, wherein the bits of the first type: are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes, when said computer program is run by a computer.

Embodiments provide an interleaver for interleaving an LDPC encoded bit sequence, wherein the interleaver comprises a segmentation stage configured to segment [e.g., divide] the LDPC encoded bit sequence into a plurality of chunks [e.g., of equal length], the plurality of chunks comprising a first chunk and one or more other chunks [e.g., a second chunk and optionally a third chunk], a first interleaver stage, configured to interleave the one or more other chunks or a concatenated version thereof [for example, to interleave the second chunk and optionally the third chunk, or to interleave a concatenated version of the second chunk and the third chunk], a second interleaver stage, configured to block wise interleave the first chunk of the plurality of chunks and an interleaved bit sequence provided by the first interleaver stage, to obtain an interleaved version of the LDPC encoded bit sequence, wherein the first chunk of the plurality of chunks consists of [e.g., only comprises] bits of a first type, wherein the bits of the first type
- are error correcting bits of the LDPC encoded bit sequence,
- are repeat accumulate bits of the LDPC encoded bit sequence, and/or
- are represented, in a Tanner graph representation of the LDPC encoded bit sequence, by variable nodes that comprise non-random connections to at least two error correcting check nodes [e.g., each of the variable nodes being connected to two consecutive check nodes].

In embodiments, the first chunk bypasses the first interleaver stage [e.g., the first chunk is not interleaved by the first interleaver stage].

In embodiments, one chunk [e.g., the second chunk] of the one or more other chunks consist of bits of a second type, wherein the bits of the second type
- are information bits of the LDPC encoded bit sequence [and, for example, remaining error correcting bits of the LDPC encoded bit sequence], and/or
- are represented, in a Tanner graph representation of the LDPC encoded bit sequence, by variable nodes that comprise pseudo random connections to error correcting check nodes.

In embodiments, the one or more other chunks are two or more other chunks, wherein another chunk [e.g., the third chunk] of the two or more other chunks consist of bits of the first type.

In embodiments, the first interleaver stage is a pseudo-random interleaver.

In embodiments, the pseudorandom interleaver is based on a linear shift register.

In embodiments, the pseudorandom interleaver is a block wise interleaver.

In embodiments, the first interleaver stage is configured to interleave the one or more other chunks [e.g., a concatenated version of the other chunks] based on the following syntax:

$$\text{for } j = 0: ((N_{chunks} - 1)N_{bits/chunk}) - 1$$

$$\widetilde{Ch}_{0 \to N_{chunks}-1 \backslash 1}(j) = Ch_{0 \to N_{chunks}-1 \backslash 1}(\pi(j))$$

wherein j represents a control variable, wherein $N_{chunks}$ represents the number of the plurality of chunks the LDPC encoded bit sequence is segmented into, wherein $N_{bits/chunk}$ represents the number of bits per chunk, wherein $$\widetilde{Ch}_{0 \to N_{chunks}-1 \backslash 1}$$

represents me interleaved bit sequence [e.g., an interleaved version of (a concatenated version) of the one or more other chunks], wherein $Ch_{0 \to N_{chunks}-1 \backslash 1}$ represents a concatenated version of the one or more other chunks, wherein π represents a permutation indices vector of a linear feedback shift register.

In embodiments, the second interleaver stage is a block wise interleaver.

In embodiments, the second interleaver stage is configured to distribute the interleaved version of the LDPC encoded bit sequence over a plurality of sub-data packets.

In embodiments, the second interleaver stage is configured to distribute block wise bits of the first chunk of the plurality of chunks over the plurality of sub-data packets in at least two rounds [e.g., such that in a first round consecutive blocks of bits [e.g., of two bits] of the first chunk are cyclically mapped to the plurality of sub-data packets, and in a second round further consecutive blocks of bits [e.g., of two bits] of the first chunk are cyclically mapped to the plurality of sub-data packets], In embodiments, the second interleaver stage is configured to evenly distribute block wise bits of the interleaved bit sequence provided by the first interleaver stage over the plurality of sub-data packets [e.g., the plurality of sub-data packets are filled up evenly with bits of the interleaved bit sequence provided by the first interleaver stage].

In embodiments, the second interleaver stage is configured to interleave the first chunk and the interleaved bit sequence provided by the first interleaver stage based on the following syntax:

$$\text{for } i = 0: N_{hops} - 1$$
$$\quad \text{for } j = 0: N_{bits/round}^{(1)} - 1$$
$$\quad\quad \text{for } k = 0: N_{rounds}^{(1)} - 1$$

-continued

```
        ṽ(j + iN_bits/hop + kN_bits/round^(1)) = Ch_1(j + iN_bits/round^(1) + kN_hops N_bits/round^(1))
      end
    end
    for j = 0: N_bits/round^(0→N_chunks−1\1) − 1
        ṽ(j + iN_bits/hop + N_bits/chunk/hop) = C̃h_{0→N_chunks−1\1} (j + iN_bits/round^(0→N_chunks−1\1))
    end
end
Output: ṽ
``` wherein i represents a control variable, wherein j represents a control variable, wherein k represents a control variable, wherein $N_{chunks}$ represents a number of chunks the LDPC encoded bit sequence is segmented into, wherein $N_{hops}$ represents a number of sub-data packets over which the interleaved version of the LDPC encoded bit sequence is distributed, wherein $N_{bits/round}^{(1)}$ represents a number of bits per round which are taken from the first chunk and are distributed over the plurality of sub-data packets, wherein N bits/hop represents a number of bits per sub-data packet, wherein ṽ represents the interleaved version of the LDPC encoded bit sequence, wherein $Ch_1$ represents the first chunk, wherein $\widetilde{Ch}_{0→N_{chunks}-1\backslash 1}$ represents the interleaved bit sequence [e.g., an interleaved version of (a concatenated version) of the one or more other chunks].

In embodiments, a number of the plurality of chunks into which the LDPC encoded bit sequence is segmented is equal to one divided by the code rate of the LDPC encoded bit sequence [Nchunks=1/r].

In embodiments, the segmentation stage is configured to segment the LDPC encoded bit sequence 102 into the plurality of chunks based on the following syntax:

```
for i = 0: N_chunks − 1
    for j = 0: N_bits/chunk − 1
        Ch_i(j) = v(j + iN_bits/chunk)
    end
end
``` wherein i represents a control variable, wherein j represents a control variable, wherein $N_{chunks}$ represents a number of chunks the LDPC encoded bit sequence is segmented into, wherein $N_{bits/chunk}$ represents the number of bits per chunk, wherein $Ch_i$ represents each of the plurality of chunks, and wherein v represents the LDPC encoded bit sequence.

In embodiments, the one or more other chunks are two or more other chunks, wherein the first interleaver stage is configured to interleave a concatenated version of the two or more other chunks.

In embodiments, the interleaver comprises a concatenation stage configured to concatenate the two or more other chunks, to obtain the concatenated version of the two or more other chunks.

In embodiments, the concatenation stage is configured to concatenate the one or more other chunks of the plurality of chunks based on the following syntax:

```
k = 0
for i = 0: N_chunks − 1
    if (i == 1)
        continue
    end
    for j = 0: N_bits/chunk − 1
        Ch_{0→N_chunks−1\1}(j + kN_bits/chunk) = Ch_i(j)
    end
    k = k + 1
end
``` wherein k represents a control variable, wherein i represents a control variable, wherein j represents a control variable, wherein $N_{bits/chunk}$ represents a number of bits per chunk, wherein $Ch_{0→N_{chunks}-1\backslash 1}$ represents a concatenated version of the one or more other chunks, wherein $Ch_i$ represents each of the plurality of chunks.

In embodiments, the interleaver is configured to interleave the LDPC encoded bit sequence, to obtain an interleaved version of the LDPC encoded bit sequence based on the following syntax:

```
Input: v, r, n, N_hops, N_bits/round^(1), π
N_chunks = 1/r
N_bits/chunk = n/N_chunks
N_bits/hop = n/N_hops
N_rounds^(1) = n/(N_chunks × N_hops × N_bits/round^(1))
N_bits/chunk/hop = N_bits/chunk/N_hops
N_bits/round^(0→N_chunks−1\1) = (N_chunks − 1) × N_bits/chunk/hop
%_____Segmentation_____%
for i = 0: N_chunks − 1
    for j = 0: N_bits/chunk − 1
        Ch_i(j) = v(j + iN_bits/chunk)
    end
end
%_____Concatenation_____%
k = 0
for i = 0: N_chunks − 1
    if (i == 1)
        continue
    end
    for j = 0: N_bits/chunk − 1
```

```
Ch_{0→N_chunks-1\1}(j + kN_{bits/chunk}) = Ch_i(j)
  end
  k = k + 1
end
%            Random Interleaver           %
for j = 0: ((N_{chunks} - 1)N_{bits/chunk}) - 1
  C̃h_{0→N_chunks-1\1}(j) = Ch_{0→N_chunks-1\1}(π(j))
end
%            Block Interleaver            %
for i = 0: N_{hops} - 1
  for j = 0: N_{bits/round}^{(1)} - 1
    for k = 0: N_{rounds}^{(1)} - 1
      ṽ(j + iN_{bits/hop} + kN_{bits/round}^{(1)}) = Ch_1(j + iN_{bits/round}^{(1)} + kN_{hops}N_{bits/round}^{(1)})
    end
  end
  for j = 0: N_{bits/round}^{(0→N_chunks-1\1)} - 1
    ṽ(j + iN_{bits/hop} + N_{bits/chunk/hop}) = C̃h_{0→N_chunks-1\1} (j + iN_{bits/round}^{(0→N_chunks-1\1)})
  end
end
Output: ṽ
``` wherein i represents a control variable,
wherein j represents a control variable,
wherein n represents a number of bits (e.g., information bits+redundancy bits) of the LDPC encoded bit sequence,
wherein k represents a control variable,
wherein r represents the code rate,
wherein $N_{chunks}$ represents a number of chunks the LDPC encoded bit sequence is segmented into,
wherein $N_{hops}$ represents a number of sub-data packets over which the interleaved version of the LDPC encoded bit sequence is distributed,
wherein $N_{rounds}^{(1)}$ represents a number of rounds that may be used to distribute the bits of the first chunk,
wherein $N_{bits/round}^{(1)}$ represents a number of bits per round which are taken from the first chunk and are distributed over the plurality of sub-data packets,
wherein $N_{bits/round}^{(0→N_{chunks}-1\backslash 1)}$ represents a number of bits per round which are taken from the other chunks and are distributed over the plurality of sub-data packets,
wherein $N_{bits/hop}$ represents a number of bits per sub-data packet,
wherein $N_{bits/chunk}$ represents a number of bits per chunk,
wherein $N_{bits/chunk/hop}$ represents a number of bits per chunk per hop,
wherein v represents the LDPC encoded bit sequence,
wherein ṽ represents the interleaved version of the LDPC encoded bit sequence,
wherein $Ch_i$ represent each of the plurality of chunks,
wherein $Ch_1$ represents the first chunk,
wherein $$\widetilde{Ch}_{0→N_{chunks}-1\backslash 1}$$

represents the interleaved bit sequence [e.g., an interleaved version of [a concatenated version] of the one or more other chunks].

Further embodiments provide an interleaver for interleaving an LDPC encoded codeword, the LDPC encoded codeword comprising a bit sequence of 736 FEC encoded bits, wherein the interleaver comprises a segmentation stage configured to segment the bit sequence z of 736 FEC encoded bits into four equally sized chunks, the four chunks comprising a chunk number one, a chunk number two, a chunk number three and a chunk number four, a first interleaver stage configured to pseudo randomly scramble a sequence y of bits consisting of the chunk number one, the chunk number three and the chunk number four, to obtain a scrambled version y' of the sequence of bits, wherein the sequence y is pseudo randomly scrambled using a scramble vector u, which is derived from a pseudo random sequence v, generated by a 10-bit Galois LFSR with generator polynomial $g(x)=x^{10}+x^7+1$, a second interleaver stage configured to distribute the chunk number two over L radio-bursts by assigning every bit $c_n$ of the chunk number two (110_1), a radio-burst index l and a position i within the radio-burst dependent on the index n based on the following syntax:

$$l(n) = \left\lfloor \frac{n}{2} \right\rfloor \mod 23,$$

$$i(n) = 2 \cdot \left\lfloor \frac{n}{46} \right\rfloor + (n \mod 2),$$

with n ∈ {0,1,2 ... 183}, where n=0 refers to the first bit $c_0$ of the chunk number two (110_1), wherein the second interleaver stage (108) is configured to distribute the scrambled version y' (112) of the sequence of bits over the L radio-bursts by assigning a radio-burst index l and a position i dependent on the index m based on the following syntax:

$$l(m) = \left\lfloor \frac{m}{24} \right\rfloor,$$

$$i(m) = 8 + (m \mod 24),$$

with m ∈ {0,1,2 ... 551}, where m=0 refers to the first bit $y'_0$ of the scrambled version y' (112) of the sequence of bits.

Further embodiments provide a transmitter, comprising an interleaver according to one of the embodiments described herein, an LDPC encoder configured to provide the LDPC encoded bit sequence, and a transmitting unit configured to transmit the interleaved version of the LDPC encoded bit sequence using a plurality of sub-data packets, wherein the plurality of sub-data packets are transmitted non-concurrently [e.g., using a time and/or frequency hopping pattern].

Further embodiments provide a de-interleaver for de-interleaving an interleaved version of an LDPC encoded bit sequence, the de-interleaver comprising a first de-interleaver stage, configured to block wise de-interleave the interleaved version of the LDPC encoded bit sequence, to obtain a first chunk and an interleaved bit sequence [e.g., an interleaved version of one or more other chunks [e.g., a second chunk and optionally a third chunk] or a concatenated version of two or more other chunks [e.g., a second chunk and a third chunk]], a second de-interleaver stage, configured to de-interleave the interleaved bit sequence, to obtain the one or more other chunks [e.g., the second chunk and optionally the third chunk], a concatenation stage, configured to concatenate the first chunk and the one or more other chunks, to obtain the LDPC encoded bit sequence, wherein the first chunk of the plurality of chunks consists of [e.g., only comprises] bits of a first type, wherein the bits of the first type

- are error correcting bits of the LDPC encoded bit sequence,
- are repeat accumulate bits of the LDPC encoded bit sequence, and/or
- are represented, in a Tanner graph representation of the LDPC encoded bit sequence, by variable nodes that comprise non-random connections to at least two error correcting check nodes [e.g., each of the variable nodes being connected to two consecutive check nodes].

In embodiments, the first chunk bypasses the second de-interleaver stage [e.g., the first chunk is not de-interleaved by the second de-interleaver stage].

In embodiments, one chunk [e.g., the second chunk] of the one or more other chunks consist of bits of a second type, wherein the bits of the second type

- are information bits of the LDPC encoded bit sequence [and, for example, remaining error correcting bits of the LDPC encoded bit sequence], and/or
- are represented, in a Tanner graph representation of the LDPC encoded bit sequence, by variable nodes that comprise pseudo random connections to error correcting check nodes.

In embodiments, the one or more other chunks are two or more other chunks, wherein another chunk [e.g., the third chunk] of the two or more other chunks consist of bits of the first type.

In embodiments, the first de-interleaver stage is a block-wise de-interleaver.

In embodiments, the second de-interleaver stage is a pseudorandom de-interleaver.

In embodiments, the pseudorandom de-interleaver is based on a linear shift register.

In embodiments, the pseudorandom de-interleaver is a block wise de-interleaver.

In embodiments, the interleaved bit sequence is an interleaved is an interleaved version of a concatenated version of two or more other chunks, wherein the second de-interleaver stage is configured to de-interleave the interleaved version of the concatenated version of the two or more other chunks.

Further embodiments provide a receiver, wherein the receiver comprises a receiving unit, configured to receive a plurality of sub-data packets that are transmitted non-concurrently [e.g., using a time and/or frequency hopping pattern] from a transmitter to the receiver, a de-interleaver according to one-of the preceding claims, wherein the de-interleaver is configured to iteratively de-interleave, using channel state information describing a channel between the transmitter and the receiver, a faded version of the LDPC encoded bit sequence transmitted with the plurality of sub-data packets, and an iterative decoder, configured to iteratively decode the LDPC encoded bit sequence iteratively provided by the de-interleaver, wherein the channel state information is iteratively updated based on a decoded bit sequence provided by the iterative decoder.

Further embodiments provide a method for interleaving an LDPC encoded bit sequence. The method comprises a step of segmenting the LDPC encoded bit sequence into a plurality of chunks, the plurality of chunks comprising a first chunk and one or more other chunks. Further, the method comprises a step of interleaving the one or more other chunks or a concatenated version thereof, to obtain an interleaved bit sequence. Further, the method comprises a step of block wise interleaving the first chunk of the plurality of chunks and the interleaved bit sequence, to obtain an interleaved version of the LDPC encoded bit sequence. Thereby, the first chunk of the plurality of chunks consists bits of a first type, wherein the bits of the first type

- are error correcting bits of the LDPC encoded bit sequence,
- are repeat accumulate bits of the LDPC encoded bit sequence, and/or
- are represented, in a Tanner graph representation of the LDPC encoded bit sequence, by variable nodes that comprise non-random connections to at least two error correcting check nodes.

Further embodiments provide a method for interleaving an LDPC encoded codeword, the LDPC encoded codeword comprising a bit sequence of 736 FEC encoded bits. The method comprises a step of segmenting the bit sequence z of 736 FEC encoded bits into four equally sized chunks, the four chunks comprising a chunk number one, a chunk number two, a chunk number three and a chunk number four. Further, the method comprises a step of pseudo randomly scrambling a sequence y of bits consisting of the chunk number one, the chunk number three and the chunk number four, to obtain a scrambled version y' of the sequence of bits, wherein the sequence y is pseudo randomly scrambled using a scramble vector u, which is derived from a pseudo random sequence v, generated by a 10-bit Galois LFSR with generator polynomial $g(x)=x^{10}+x^7+1$. Further, the method comprises a step of distributing the chunk number two (110_1) over L radio-bursts by assigning every bit $c_n$ of the chunk number two (110_1), a radio-burst index l and a position i within the radio-burst dependent on the index n based on the following syntax:

$$l(n) = \left\lfloor \frac{n}{2} \right\rfloor \bmod 23,$$

$$i(n) = 2 \cdot \left\lfloor \frac{n}{46} \right\rfloor + (n \bmod 2),$$

with n ∈ {0,1,2 ... 183}, where n=0 refers to the first bit $c_0$ of the chunk number two (110_1). Further, the method comprises a step of distributing the scrambled version y' (112) of the sequence of bits over the L radio-bursts by assigning a radio-burst index l and a position i dependent on the index m based on the following syntax:

$$l(m) = \left\lfloor \frac{m}{24} \right\rfloor,$$

$$i(m) = 8 + (m \bmod 24),$$

with m∈{0,1,2 . . . 551}, where m=0 refers to the first bit y'₀ of the scrambled version y' (112) of the sequence of bits.

Further embodiments provide a method for de-interleaving an interleaved version of an LDPC encoded bit sequence. The method comprises a step of block wise de-interleaving the interleaved version of the LDPC encoded bit sequence, to obtain a first chunk and an interleaved version of one or more other chunks. Further, the method comprises a step of de-interleaving the interleaved version of the one or more other chunks, to obtain the one or more other chunks. Further, the method comprises a step of concatenating the first chunk and the one or more other chunks, to obtain the LDPC encoded bit sequence. Thereby, the first chunk of the plurality of chunks consists of bits of a first type, wherein the bits of the first type

- are error correcting bits of the LDPC encoded bit sequence,
- are repeat accumulate bits of the LDPC encoded bit sequence, and/or
- are represented, in a Tanner graph representation of the LDPC encoded bit sequence, by variable nodes that comprise non-random connections to at least two error correcting check nodes.

BRIEF DESCRIPTION OF THE DRAWINGS

Embodiments of the present invention will be detailed subsequently referring to the appended drawings, in which.

DETAILED DESCRIPTION OF THE INVENTION

Figure 1:
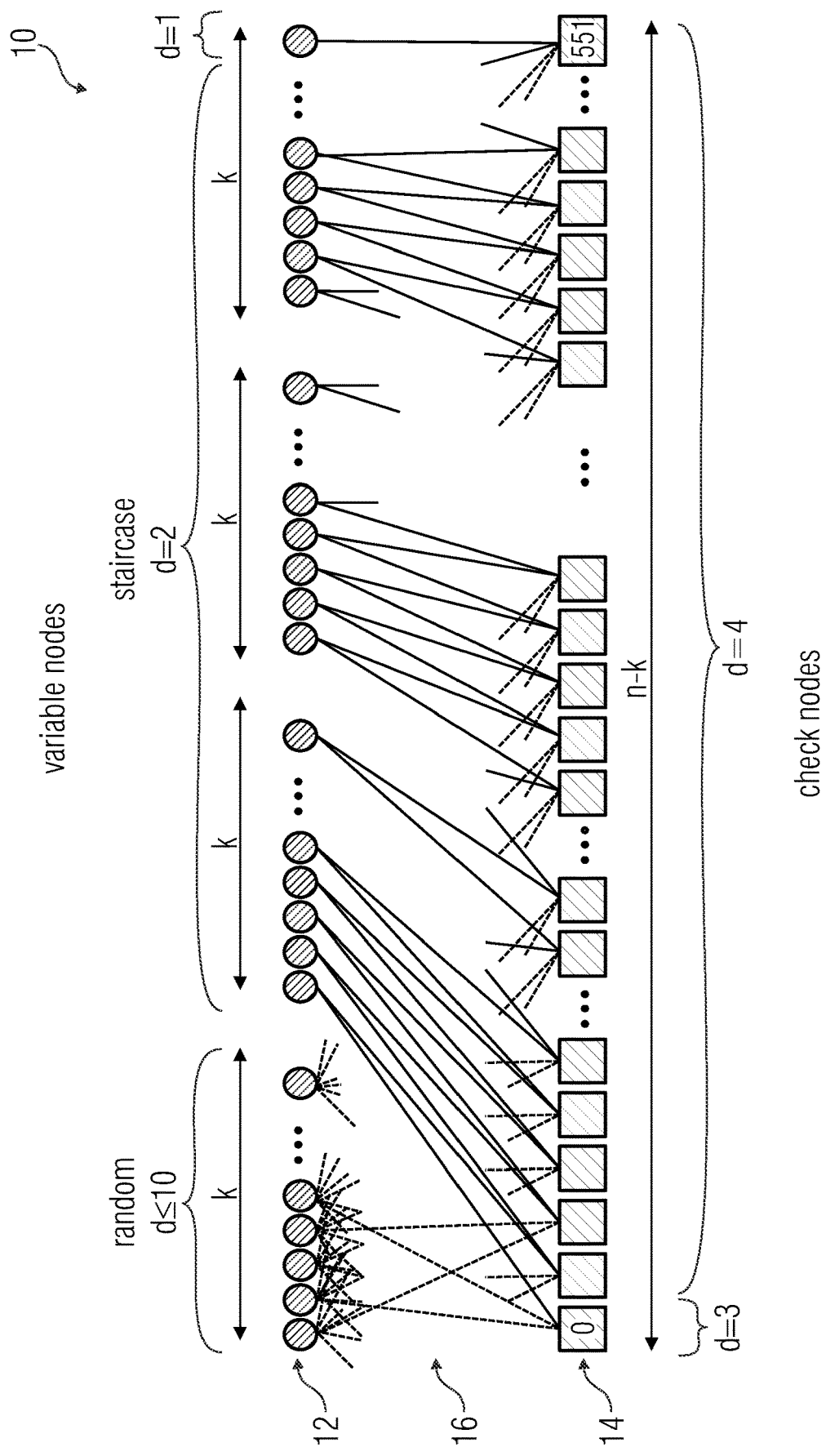
FIG. 1 shows a schematic view of a Tanner graph representation of an LDPC code proposed in [3]

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

Figure 2:
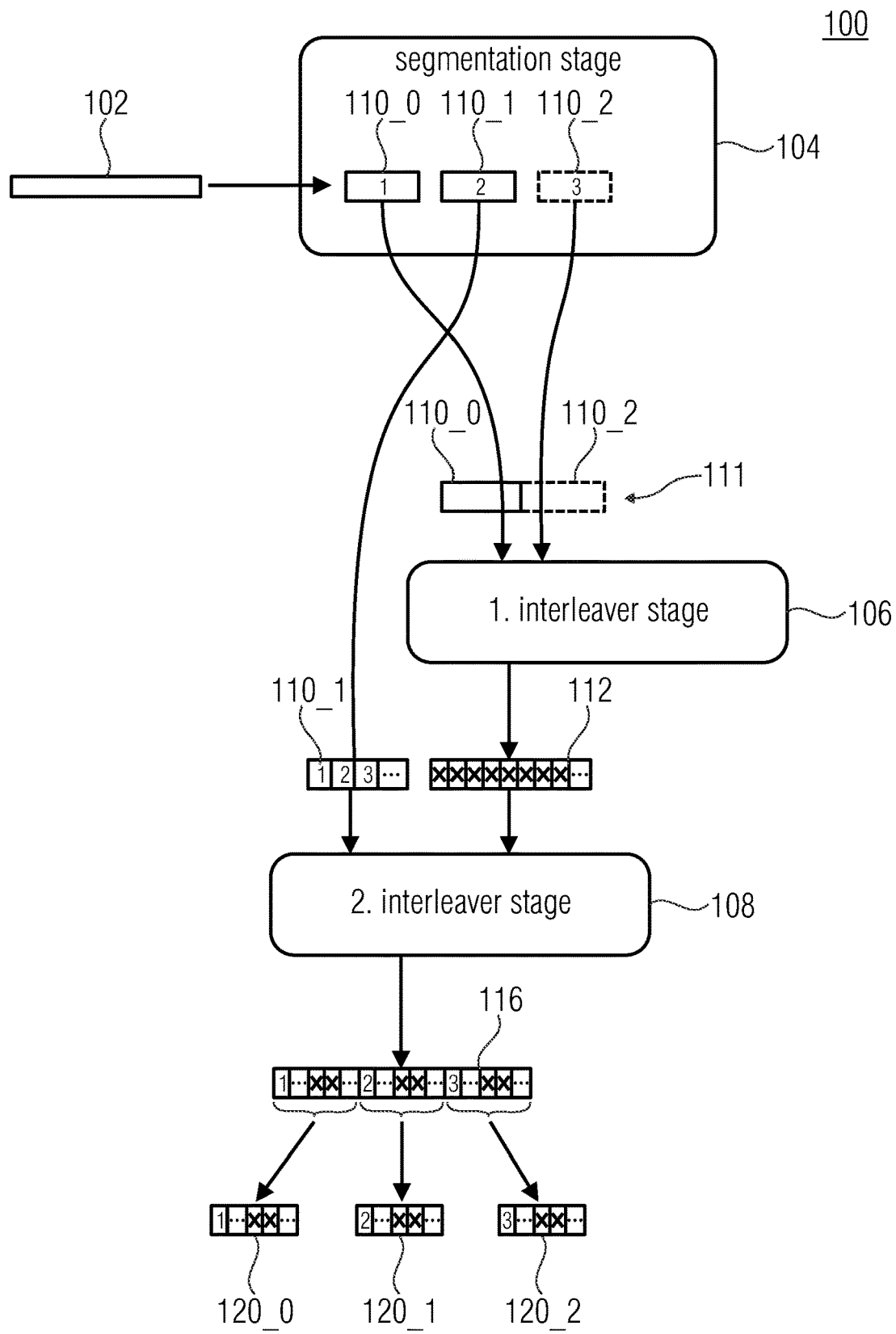
FIG. 2 shows a schematic block diagram of an interleaver, according to an embodiment of the present invention.

FIG. 2 shows a schematic block diagram of an interleaver 100 for interleaving an LDPC encoded bit sequence 102, according to an embodiment of the present invention. The interleaver 100 comprises a segmentation stage 104, a first interleaver stage 108 and a second interleaver stage 110.

The segmentation stage 104 can be configured to segment (e.g., divide) the LDPC encoded bit sequence 102 into a plurality of chunks 110_0 to 110_$N_{chunks}$−1 (e.g., of equal length), $N_{chunks}$≥2, wherein the plurality of chunks comprises a first chunk 110_1 and one or more other chunks, such as a zero-th chunk 110_0 and optionally a second chunk 110_2.

Thereby, (e.g., the segmentation stage 104 can be configured to segment the LDPC encoded bit sequence 102 into the plurality of chunks 110_0 to 110_$N_{chunks}$−1 in such a way that) the first chunk 110_1 consists of (e.g., only comprises) bits of a first type, wherein the bits of the first type are at least one out of

- error correcting bits of the LDPC encoded bit sequence 102,
- repeat accumulate bits of the LDPC encoded bit sequence 102,
- represented, in a Tanner graph representation of the LDPC encoded bit sequence 102, by variable nodes that comprise non-random connections to at least two error correcting check nodes (e.g., each of the variable nodes being connected to two consecutive check nodes).

The first interleaver stage 108 can be configured to interleave the one or more other chunks provided by the segmentation stage 106, such as the zero-th chunk 110_0 and optionally the second chunk 110_2, or to interleave, in case of that two or more other chunks are provided by the segmentation stage 104, a concatenated version of the two or more other chunks, for example, a concatenated version of the zero-th chunk 110_0 and the second chunk 110_2, to obtain an interleaved bit sequence 112.

The second interleaver stage 110 can be configured to block-wise interleave the first chunk 110_1 provided by the segmentation stage 104 and the interleaved bit sequence 112 provided by the first interleaver stage 106, to obtain an interleaved version 116 of the LDPC encoded bit sequence.

As shown in FIG. 2, the first chunk 110_1 bypasses the first interleaver stage 106, or in other words, the first chunk 110_1 is not interleaved by the first interleaver stage 106.

Observe that, in embodiments, the first chunk 110_1 does not refer to a specific chunk of an order (or sequence) of the plurality of chunks, such as to chunk number one being the start or beginning of the order (or sequence) of the plurality of chunks, i.e., followed by chunk number two and optionally chunk number three, as indicated in FIG. 2 by numbers 1, 2 and 3 within the chunks. Quite the contrary, the first chunk 110_1 refers to the chunk of the plurality of chunks which consists of the bits of the first type, i.e., error correcting bits of the LDPC encoded bit sequence, repeat accumulate bits of the LDPC encoded bit sequence, and/or bits that are represented, in a Tanner graph representation of the LDPC encoded bit sequence, by variable nodes that comprise non-random connections to at least two error correcting check nodes. For example, referring to the (736, 184) LDPC code proposed in [3] and assuming that said LDPC code is segmented into four chunks of equal size: chunk number one (e.g., having bits 1 to 184 of bits 1 to 736), followed by chunk number two (e.g., having bits 185 to 368 of bits 1 to 736), followed by chunk number three (e.g., having bits 369 to 552 of bits 1 to 736), followed by chunk number four (e.g., having bits 553 to 736 of bits 1 to 736); the first chunk 110_1 denotes (or refers to) the chunk number two, since the chunk number two consists of error correcting bits of the LDPC encoded bit sequence, repeat accumulate bits of the LDPC encoded bit sequence, and/or bits that are represented, in a Tanner graph representation of the LDPC encoded bit sequence, by variable nodes that comprise non-random connections to at least two error correcting check nodes.

In embodiments, (e.g., the segmentation stage 104 can be configured to segment the LDPC encoded bit sequence 102 into the plurality of chunks 110_0 to 110_N$_{chunks}$−1 in such a way that) one chunk of the one or more other chunks, such as the zero-th chunk 110_0, consist of bits of a second type, wherein the bits of the second type are at least one out of
information bits of the LDPC encoded bit sequence, and/or
represented, in a Tanner graph representation of the LDPC encoded bit sequence, by variable nodes that comprise pseudo random connections to error correcting check nodes.

In embodiments, (e.g., the segmentation stage 104 can be configured to segment the LDPC encoded bit sequence 102 into the plurality of chunks 110_0 to 110_N$_{chunks}$−1 in such a way that) another chunk of the other chunks, such as the second chunk 110_2, consist of (e.g., only comprises) bits of the first type, i.e. at least one out of
error correcting bits of the LDPC encoded bit sequence 102,
repeat accumulate bits of the LDPC encoded bit sequence 102,
represented, in a Tanner graph representation of the LDPC encoded bit sequence 102, by variable nodes that comprise non-random connections to at least two error correcting check nodes (e.g., each of the variable nodes being connected to two consecutive check nodes).

In embodiments, the first interleaver stage 106 can be a pseudo random interleaver, such as a linear feedback shift register based interleaver or a block interleaver.

In embodiments, the second interleaver stage 108 can be a block-wise interleaver. The block-wise interleaver 108 can be configured to distribute the interleaved version of the LDPC encoded bit sequence 116 over a plurality of sub-data packets 120_0 to 120_N$_{hops}$−1, $N_{hops} \geq 2$.

Thereby, the block-wise interleaver 108 can be configured to distribute block-wise bits of the first chunk 110_1 of the plurality of chunks over the plurality of sub-data packets 120_0 to 120_N$_{hops}$−1 in at least two rounds, e.g., such that in a first round consecutive blocks of bits (e.g., of two consecutive bits) of the first chunk 110_1 are cyclically mapped to the plurality of sub-data packets 120_0 to 120_N$_{hops}$−1, and in a second round further consecutive blocks of bits (e.g., of two consecutive bits) of the first chunk 110_1 are cyclically mapped to the plurality of sub-data packets 120_0 to 120_N$_{hops}$−1, and so on until all bits of the first chunk 110_1 are block-wise distributed over the plurality of sub-data packets 120_0 to 120_N$_{hops}$−1.

For example, exemplarily assuming that the interleaved version 116 of the LDPC encoded bit sequence is distributed over three sub-data packets 120_0 to 120_2, the block-wise interleaver 108 can be configured to map, in a first round, a zero-th and first bit of the first chunk 110_1 to the zero-th sub-data packet 120_0, a second and a third bit of the first chunk 110_1 to the first sub-data packet 120_1, and a fourth and a fifth bit of the first chunk 110_1 to the second sub-data packet 120_2. Further, the block-wise interleaver 108 can be configured to map, in a second round, a sixth and a seventh bit of the first chunk 110_1 to the zero-th sub-data packet 120_0, an eight and a ninth bit of the first chunk 110_1 to the first sub-data packet 120_1, and a tenth and an eleventh bit of the first chunk 110_1 to the second sub-data packet 120_2. This procedure can be repeated until all the bits of the first chunk 110_1 are distributed over the plurality of sub-data packets.

Further, the block-wise interleaver 108 can be configured to evenly distribute bits of the interleaved bit sequence 112 provided by the first interleaver stage 106 block-wise over the plurality of sub-data packets, (e.g., the plurality of sub-data packets 120_0 to 120_N$_{hops}$−1 are filled up evenly with bits of the interleaved bit sequence 112 provided by the first interleaver stage 106).

For example, continuing with the example of that the interleaved version 116 of the LDPC encoded bit sequence is distributed over three sub-data packets 110_0 to 110_2, the block-wise interleaver 108 can be configured to fill up the zero-th sub-data packet 120_0 by mapping a zero-th block of bits of the interleaved bit sequence 112 to the zero-th sub-data packet 120_0, to fill up the first sub-data packet 120_1 by mapping a first block of bits of the interleaved bit sequence 112 to the first sub-data packet 120_1, and to fill up the second sub-data packet 120_2 by mapping a second block of bits of the interleaved bit sequence 112 to the second sub-data packet 120_2.

Subsequently, embodiments of the interleaver 100 are described in further detail.

1. Hybrid Block-Wise—Random Interleaver

In order to overcome the detrimental effect of the limited channel knowledge as described in the introductory part of the present patent application, in embodiments the bits of the LDPC codeword are sorted in such a way that an improved (e.g., the best) use out of the initially estimated fading coefficients can be made. This means that the BP algorithm of the LDPC decoder can still be triggered even with few estimated fading coefficients. For example, a Decision Directed Channel Estimation (DDCE) [2], then can be initiated with the aid of the initially decoded LDPC codeword.

An iterative decoder can keep on traversing information between the channel estimator and the LDPC decoder till the full LDPC codeword is successfully decoded.

Embodiments provide an interleaver 100 that aims at restructuring the Tanner graph of LDPC codes with code rate $r \leq 1/2$, that exhibit a staircase structure. The incentive of the interleaver 100 according to embodiments is to allow the viability of the BP decoding algorithm with limited number of estimated fading coefficients. Because the preamble sequence is only capable of estimating the first few neighboring symbols, the interleaver 100 sorts out the LDPC bits such that the initially estimated fading coefficients meet the minimum triggering threshold of the LDPC decoder. In other words, the interleaver 100 makes it possible to increase the probability of having check nodes that have only one erased LLR received from their corresponding variable nodes.

In embodiments, two strategies are adopted. The first strategy is to swap k variable nodes that exhibit random connections with the first k variable nodes that have staircase connections. This is done for the systematic codes that have their k information bits mapped to the first k bits of the encoded codeword. In the case where the systematic information bits are not placed at the beginning of the codeword, this swapping step is not required. In other words, the objective is to start with k variable nodes that have a staircase connection. The second strategy is to distribute the bits over the transmission hops. For the swapped staircase chunk, a block-wise interleaver is adopted. This block-wise interleaver distributes the bits of the staircase chunk over the hops in successive rounds. Each round places two consecutive bits on one hop. The remaining codeword bits are interleaved by a random interleaver. Finally, they are distributed over the hops following the block-wise distributed bits.

The essence of the hybrid interleaver according to embodiments is a twofold: First, it breaks down the staircase structure of the encoded codeword. Second, it distributes the systematic part over the hops. This means that the first estimated fading coefficients would be scrambled across the codeword rather than being stacked in one chunk. Therefore, the LDPC decoder can be triggered even with minimal estimated fading coefficients.

Figure 3:
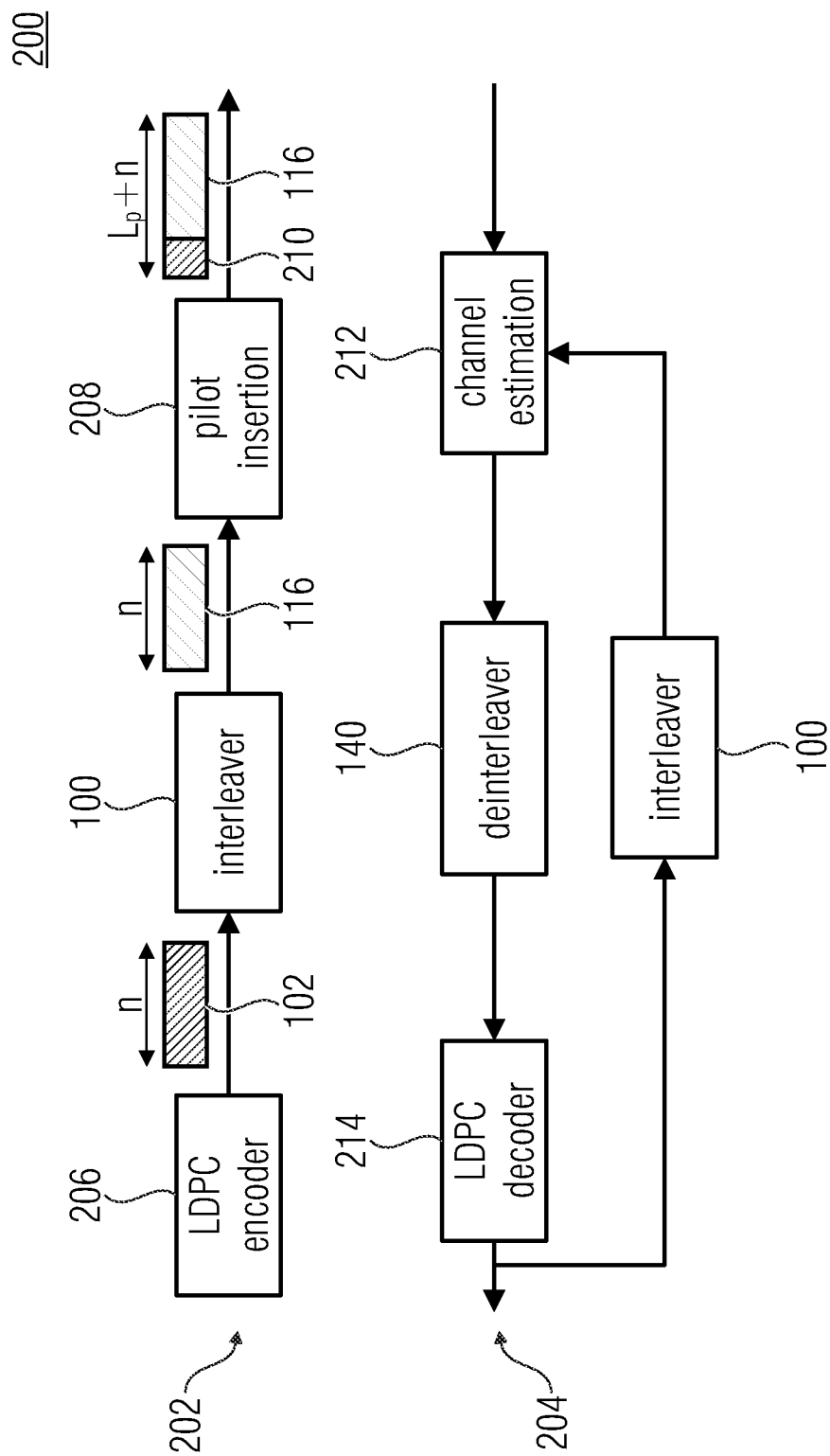
FIG. 3 shows a schematic block diagram of a system comprising a transmitter and a receiver, according to an embodiment.

FIG. 3 shows a schematic block diagram of a system 200 comprising a transmitter 202 and a receiver 204, according to an embodiment.

The transmitter 202 comprises an LDPC encoder 206 configured to provide the LDPC encoded codeword 102 (e.g., the LDPC encoded bit sequence), the interleaver 100 configured to interleave the LDPC encoded codeword 102, to obtain the interleaved version 116 of the LDPC encoded codeword, and a pilot sequence insertion unit 208 configured to add (e.g., append) a pilot sequence 210 to the interleaved version 116 of the LDPC encoded codeword.

The receiver 204 comprises a channel estimator 212, a de-interleaver 140, an iterative LDPC decoder 214, and an interleaver 100, wherein the interleaver 100 and the de-interleaver are complementary to each other.

In other words, FIG. 3 shows the system model of the (hybrid) interleaver 100 according to embodiments. An information vector of length k bits is encoded by an LDPC encoder 206 of rate r, to produce an output codeword $v=[v_0 \; v_1 \ldots v_{n-1}]$ 102 of length n bits, where $n=k/r$. The encoded codeword 102 is then interleaved by the interleaver 100 according to embodiments to produce an interleaved codeword $\tilde{v}=[\tilde{v}_0 \; \tilde{v}_1 \ldots \tilde{v}_{n-1}]$ 116 of the same length. After that, a preamble sequence 210 of length $L_p$ is appended to the interleaved vector 116. Finally, the data is modulated and transmitted over the fading channel.

At the receiver 204 side, the preamble sequence 210 is extracted and fed to the channel estimator 212. Due to the limited preamble size, the channel estimator 212 is at first only capable of providing CSI about the first neighboring symbols. Both, the received sequence and the partially estimated fading vector are deinterleaved and fed to the LDPC decoder 214. Despite the initial scarcity of CSI, the proposed interleaver design allows for the triggering of the LDPC decoder 214. Thus, the LDPC decoder 214 is still capable of providing extrinsic information. This decoded information is then interleaved and fed back to channel estimator 212 as supplementary pilot symbols. That allows for the estimation of more fading coefficients to trigger the Belief propagation decoding of LDPC with additional apriori probabilities. The iterative decoding process is successively repeated till the full LDPC codeword is decoded.

Figure 4:
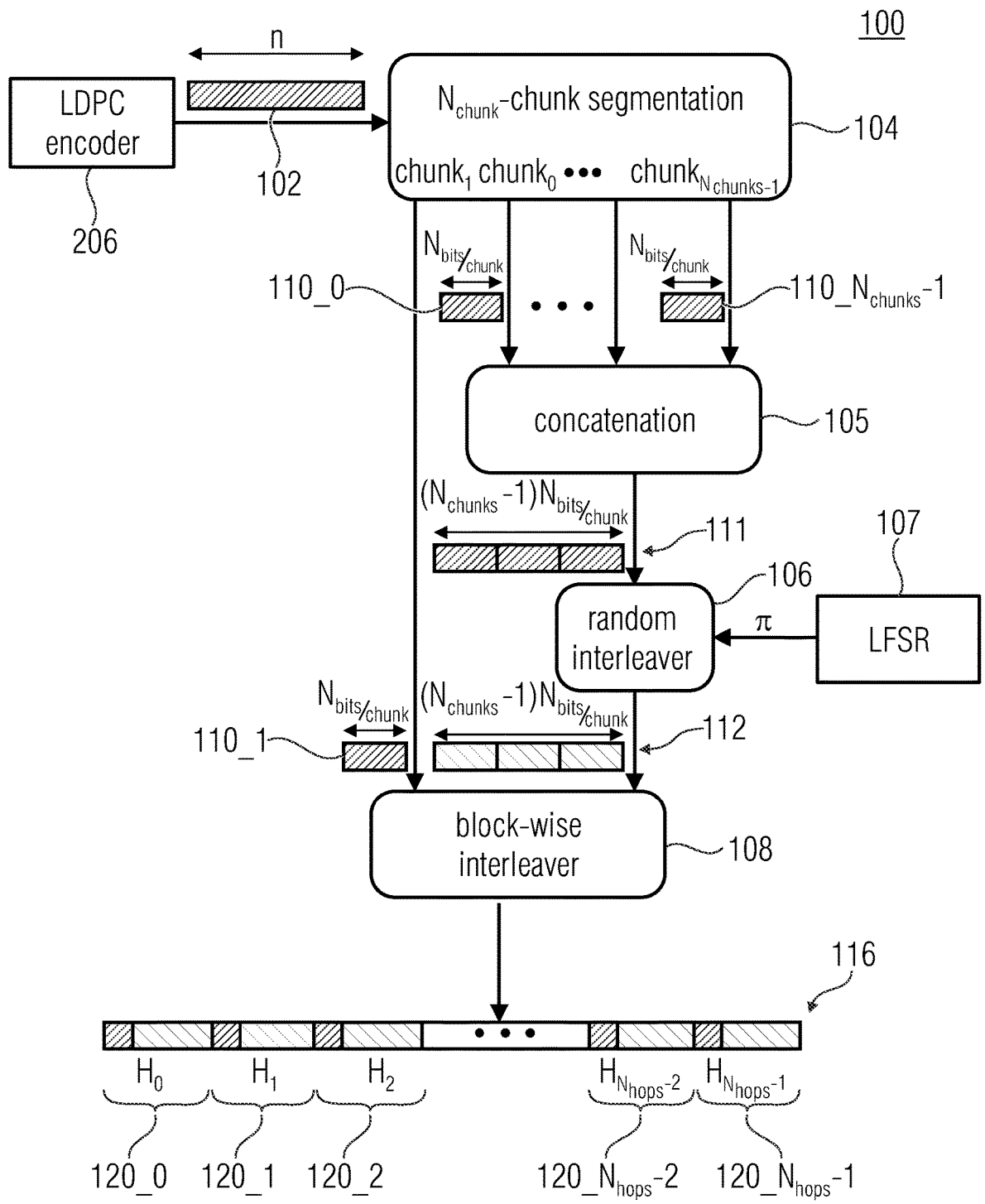
FIG. 4 shows a schematic block diagram of an interleaver for interleaving an LDPC encoded bit sequence provided by an LDPC encoder, according to an embodiment of the present invention.

FIG. 4 shows a schematic block diagram of an interleaver for interleaving an LDPC encoded bit sequence 102 provided by an LDPC encoder 206, according to an embodiment of the present invention. The interleaver 100 comprises a segmentation stage 104, a concatenation stage 105, a first interleaver stage 106 and a second interleaver stage 108.

The segmentation stage 104 can be configured to segment (e.g., divide) the LDPC encoded bit sequence 102 into a plurality of chunks $110\_0$ to $110\_N_{chunks}-1$ (e.g., of equal length), $N_{chunks} \geq 2$, wherein the plurality of chunks comprises a first chunk $110\_1$ and two or more other chunks $110\_0, 110\_2$ to $110\_N_{chunks}-1$.

Thereby, (e.g., the segmentation stage 104 can be configured to segment the LDPC encoded bit sequence 102 into the plurality of chunks $110\_0$ to $110\_N_{chunks}-1$ in such a way that) the first chunk $110\_1$ consists of (e.g., only comprises) bits of a first type, wherein the bits of the first type are at least one out of error correcting bits of the LDPC encoded bit sequence 102, repeat accumulate bits of the LDPC encoded bit sequence 102, represented, in a Tanner graph representation of the LDPC encoded bit sequence 102, by variable nodes that comprise non-random connections to at least two error correcting check nodes (e.g., each of the variable nodes being connected to two consecutive check nodes).

The concatenation stage is configured to concatenate the two or more other chunks $110\_0, 110\_2$ to $110\_N_{chunks}-1$, to obtain a concatenated version 111 of the two or more other chunks $110\_0, 110\_2$ to $110\_N_{chunks}-1$.

The first interleaver stage 108, e.g., a (pseudo)random interleaver, e.g., based on a Linear Feedback Shift Register (LFSR) 107, can be configured to interleave the concatenated version 111 of the two or more other chunks $110\_0, 110\_2$ to $110\_N_{chunks}-1$.

The second interleaver stage 110, e.g., a block-wise interleaver, can be configured to block-wise interleave the first chunk $110\_1$ provided by the segmentation stage 104 and the interleaved bit sequence 112 provided by the first interleaver stage 106, to obtain an interleaved version 116 of the LDPC encoded bit sequence.

In other words, FIG. 4 shows a block diagram of a hybrid block-wise random interleaver 100, according to an embodiment. The interleaver 100 takes an LDPC encoded codeword v 102 of length n bits, and outputs an interleaved version ṽ 116 of the same length. The interleaving process involves four steps: Segmentation (e.g., performed by the segmentation stage 104), concatenation (e.g., performed by the concatenation stage 105), random permutation (e.g., performed by the first interleaver stage 106), and block-wise assignment (e.g., performed by the second interleaver stage 108). First, the segmentation step implies the splitting of the n-bit codeword 102 into $N_{chunks}=1/r$, chunks 110_0 to 110_$N_{chunks}$−1 of equal length, where r is the code rate. The first chunk 110_1 is kept aside, while the remaining ($N_{chunks}$−1) chunks 110_0, 110_2 to 110_$N_{chunks}$−1 are concatenated back again. After that, a pseudorandom interleaver 106, which could be generated by means of a Linear Feedback Shift Register (LFSR) 107, is applied to the concatenated sequence 111. This results in a new sequence 112 with the elements of the concatenated sequence 111 placed according to the permutation indices of the LFSR 107. Finally, the interleaved sequence 112 along with the separated chunk 110_1 are fed to a block-wise interleaver 108. The objective of the latter is to distribute the bits uniformly over the transmitted hops (or sub-data packets 120_0 to 120_$N_{hops}$−1). It first starts by placing two bits from the separated chunk 110_1 on each hop 120_0 to 120_$N_{hops}$−1.

After traversing all the hops 120_0 to 120_$N_{hops}$−1, another round starts by assigning two more bits on each hop. This process is repeated until all the bits of the separated chunk 110_1 are exhausted. Meanwhile, the randomly interleaved sequence 112 is equally distributed over the hops 120_0 to 120_$N_{hops}$−1. This means that, each hop will comprise bits from the separated chunk 110_1 in a block-wise fashion, followed by the bits of the randomly interleaved chunks in a ratio of 1:$N_{chunks}$−1, respectively. These four steps are thoroughly described in the upcoming sections.

Figure 5:
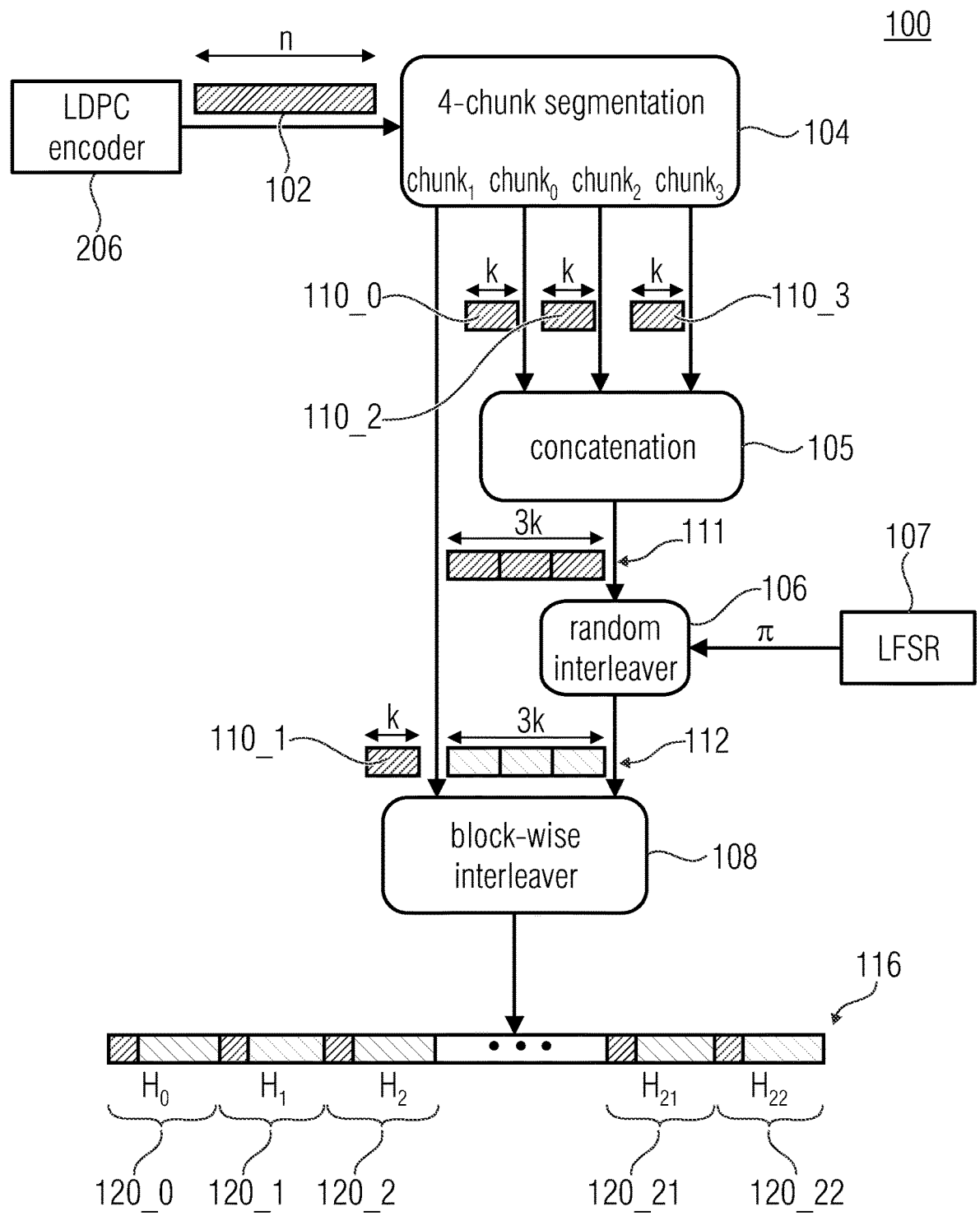
FIG. 5 shows a schematic block diagram of an interleaver for interleaving an LDPC encoded bit sequence provided by an LDPC encoder, according to an embodiment of the present invention.

FIG. 5 shows a schematic block diagram of an interleaver for interleaving an LDPC encoded bit sequence 102 provided by an LDPC encoder 206, according to an embodiment of the present invention. The interleaver 100 comprises a segmentation stage 104, a concatenation stage 105, a first interleaver stage 106 and a second interleaver stage 108.

The segmentation stage 104 can be configured to segment (e.g., divide) the LDPC encoded bit sequence 102 into four chunks 110_0 to 110_3 (e.g., of equal length), wherein the four chunks comprises a first chunk 110_1 and three other chunks 110_0, 110_2, 110_3.

Thereby, (e.g., the segmentation stage 104 can be configured to segment the LDPC encoded bit sequence 102 into the four chunks 110_0 to 110_3 in such a way that) the first chunk 110_1 consists of (e.g., only comprises) bits of a first type, wherein the bits of the first type are at least one out of
error correcting bits of the LDPC encoded bit sequence 102,
repeat accumulate bits of the LDPC encoded bit sequence 102,
represented, in a Tanner graph representation of the LDPC encoded bit sequence 102, by variable nodes that comprise non-random connections to at least two error correcting check nodes (e.g., each of the variable nodes being connected to two consecutive check nodes).

The concatenation stage 105 can be configured to concatenate the three other chunks 110_0, 110_2, 110_3, to obtain a concatenated version 111 of the three other chunks 110_0, 110_2, 110_3.

The first interleaver stage 108, e.g., a (pseudo)random interleaver, e.g., based on a Linear Feedback Shift Register (LFSR) 107, can be configured to interleave the concatenated version 111 of the three other chunks 110_0, 110_2, 110_3.

The second interleaver stage 110, e.g., a block-wise interleaver, can be configured to block-wise interleave the first chunk 110_1 provided by the segmentation stage 104 and the interleaved bit sequence 112 provided by the first interleaver stage 106, to obtain an interleaved version 116 of the LDPC encoded bit sequence.

In other words, FIG. 5 depicts an example of the (hybrid) interleaver 100 according to an embodiment applied to the (736,184) LDPC code given in [3]. Because the code rate is 1/4, the LDPC codeword 102 should be segmented into $N_{chunks}=4$ chunks. Each chunk has $n/N_{chunks}=184$ bits. The first chunk 110_1 is separated, while the zero-th, second, and third chunks 110_0, 110_2, 110_3 are concatenated back to form a vector 111 of length 3×184=552 bits. This concatenated vector 111 is randomly interleaved (e.g., by the first interleaver stage 106) and fed to a block-wise interleaver 108 with the separated first chunk 110_1. Assuming that the data has to be transmitted over $N_{hops}=23$, then the block-wise interleaver 108 should map the data to the 23 hops 120_0 to 120_22 in a block-wise fashion. It first starts by mapping two bits from the first chunk 110_1 on each hop. After 23 hops 120_0 to 120_22, 46 bits of the first chunk 110_1 would be mapped. This process can be repeated four times in order to map all the 184 bits of the first chunk 110_1. After that, the 552 bits of the randomly interleaved vector 112 can be mapped to the hops 120_0 to 120_22 with each hop containing 24 bits taken at one round.

1.1 Segmentation

Figure 6:
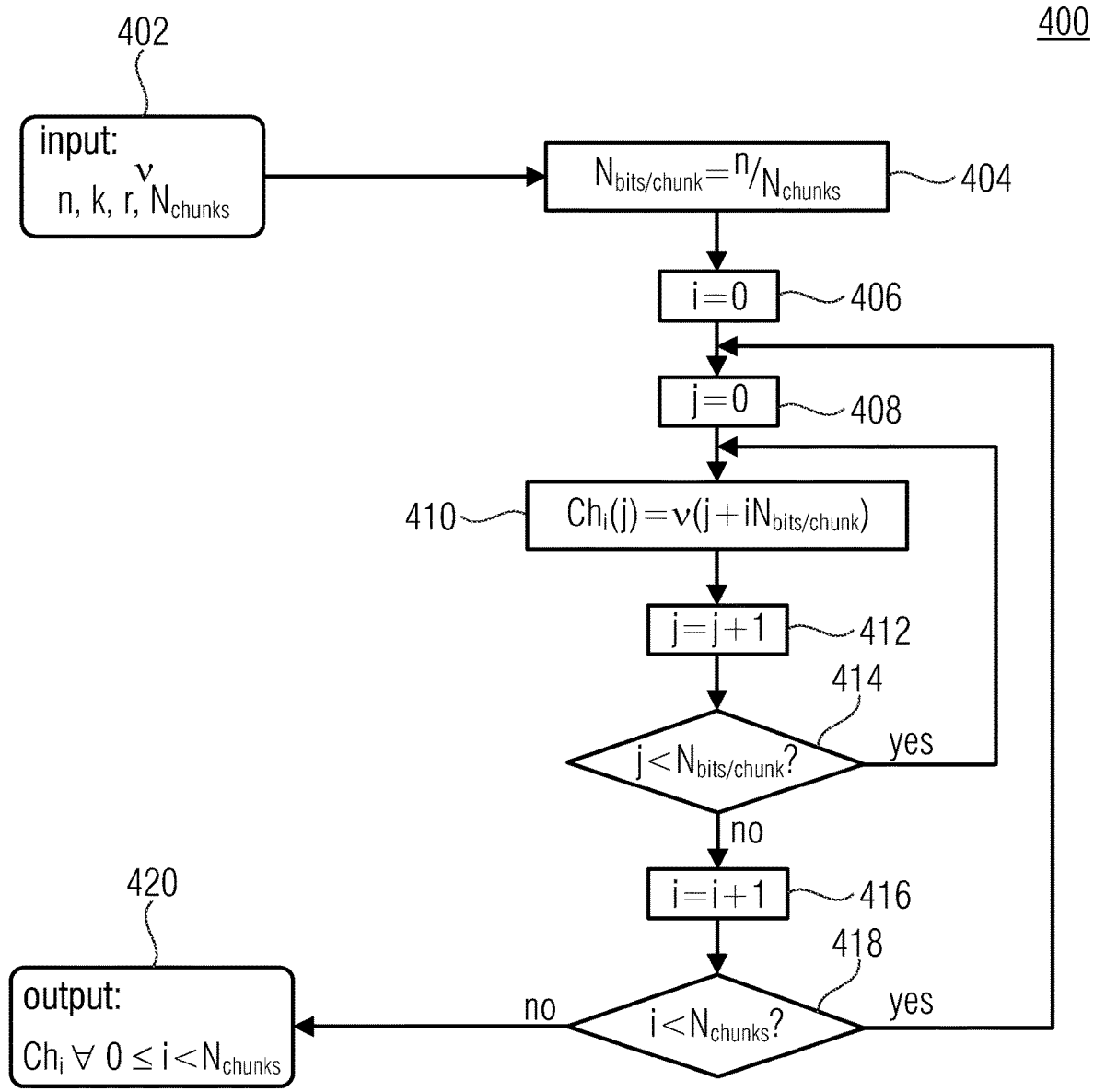
FIG. 6 shows a flowchart of a segmentation method performed by the segmentation stage, according to an embodiment of the present invention.

FIG. 6 shows a flowchart of a segmentation method 400 performed by the segmentation stage 104, according to an embodiment of the present invention.

In a first step 402, input is provided, wherein the input comprises the LDPC encoded bit sequence v, a number n of bits (e.g., information bits+redundancy bits) of the LDPC encoded bit sequence, a number k of information bits of the LDPC encoded bit sequence, a code rate r, and a number $N_{chunks}$ of chunks the LDPC encoded bit sequence is to be segmented into.

In a second step 404, a number $N_{bits/chunk}$ of bits per chunk are determined based on the equation $N_{bits/chunk}=n/N_{chunks}$.

In a third step 406, a control variable i is set to zero, i=0.

In a fourth step 408, a control variable j is set to zero, j=0.

In a fifth step 410, bits of the LDPC encoded bit sequence v are assigned to the i-th chunk $Ch_i$ based on the equation $Ch_i(j)=v(j+iN_{bits/chunk})$.

In a sixth step 412, the control variable j is increased by one, j=j+1.

In a seventh step 414, it is checked if the control variable j is smaller than the number $N_{bits/chunk}$ of bits per chunk, j<$N_{bits/chunk}$, and if yes, it is continued with the fifth step 410, else it is continued with an eighth step 416.

In the eighth step 416, the control variable i is increased by one, i=i+1.

In a ninth step 418, it is checked whether the control variable i is smaller than the number $N_{chunks}$ of chunks the LDPC encoded bit sequence is to be segmented into, i<$N_{chunks}$, and if yes, it is continued with the fourth step 408, else it is continued with a tenth step 420.

In the tenth step 420, the plurality of chunks $Ch_i \forall 0 \le i \le N_{chunks}$ are provided as output.

In embodiments, the first step (=segmentation step, e.g., performed by the segmentation stage 104) is to divide the LDPC encoded codeword 102 into $N_{chunks}$ chunks 110_0 to 110_$N_{chunks}$-1 of equal length. FIG. 6 shows the flowchart of the segmentation process. The segmentation block 104 takes in the input codeword v 102 of length n bits, and outputs $N_{chunks}$ chunks 110_0 to 110_$N_{chunks}$-1, $Ch_i \forall i=0, \ldots, N_{chunks}-1$, where $N_{chunks}=1/r$, and $r=k/n$ is the code rate. Each chunk has $N_{bits/chunk}=n/N_{chunks}$ bits taken serially from (the LDPC encoded codeword 102) v. Each chunk $Ch_i$, is given by:

$$Ch_i(j)=v(j+iN_{bits/chunk}) \forall i=0, \ldots, N_{chunks}-1, j=0, \ldots, N_{bits/chunk}-1 \quad (1)$$

Taking the (736,184) LDPC code as an example, the encoded codeword 102 is divided into four chunks 110_0 to 110_3 of length $N_{bits/chunk}=736/4=184$ bits.

In embodiments, the segmentation stage 104 can be configured to segment the LDPC encoded bit sequence 102 into the plurality of chunks based on the following syntax (e.g., by performing (e.g., running) the following pseudocode):

```
for i = 0: N_chunks - 1
    for j = 0: N_bits/chunk - 1
        Ch_i(j) = (j + iN_bits/chunk)
    end
end
``` wherein i represents a control variable, wherein j represents a control variable, wherein $N_{chunks}$ represents a number of chunks the LDPC encoded bit sequence is segmented into, wherein $N_{bits/chunk}$ represent the number of bits per chunk, wherein $Ch_i$ represents each of the plurality of chunks, and wherein v represents the LDPC encoded bit sequence.

1.2 Concatenation

Figure 7:
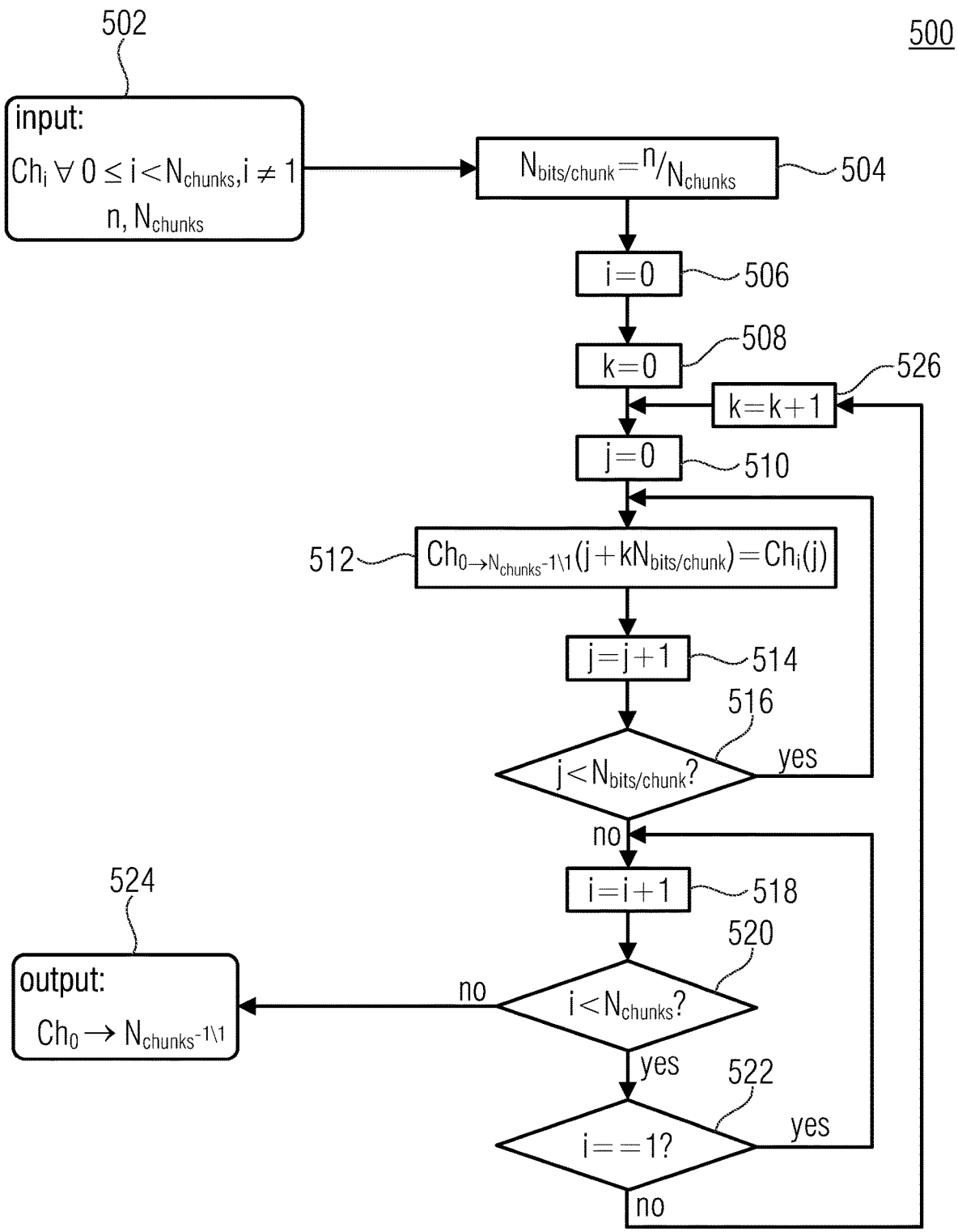
FIG. 7 shows a flowchart of a concatenation method performed by the concatenation stage, according to an embodiment of the present invention.

FIG. 7 shows a flowchart of a concatenation method 500 performed by the concatenation stage 105, according to an embodiment of the present invention.

In a first step 502, input is provided, wherein the input comprises the one or more other chunks $Ch_i, \forall i=0, \ldots, N_{chunks}-1, i \ne 1$, the number n of bits (e.g., information bits+redundancy bits) of the LDPC encoded bit sequence, and the number $N_{chunks}$ of chunks the LDPC encoded bit sequence is to be segmented into.

In a second step 504, a number $N_{bits/chunk}$ of bits per chunk are determined based on the equation $N_{bits/chunk}=n/N_{chunks}$.

In a third step 506, a control variable i is set to zero, i=0.

In a fourth step 508, a control variable k is set to zero, k=0.

In a fifth step 510, a control variable j is set to zero, j=0.

In a sixth step 512, the one or more other chunks are concatenated based on the equation $Ch_{0 \to N_{chunks}-1 \backslash 1}(j+k N_{bits/chunk})=Ch_i(j)$.

In a seventh step 514, the control variable j is increased by one, j=j+1.

In an eighth step 516, it is checked if the control variable j is smaller than the number $N_{bits/chunk}$ of bits per chunk, $j<N_{bits/chunk}$, and if yes, sixth to eighth steps 512 to 516 are repeated, else it is continued with a ninth step 518.

In the ninth step 518, the control variable i is increased by one, i=i+1.

In a tenth step 520, it is checked whether the control variable i is smaller than the number $N_{chunks}$ of chunks the LDPC encoded bit sequence is to be segmented into, $i<N_{chunks}$, and if yes, it is continued with an eleventh step 522, else it is continued with a twelfth step 524.

In the eleventh step 522, it is checked if the control variable i is identical to one, i ==1, and if yes, it continues with the ninth step 518, else it continues with the thirteenth step 526.

In the thirteenth step 526 the control variable k is increased by one, k=k+1, and it is continued with the fifth step 510.

In the twelfth step 524, a concatenated version of the one or more other chunks $Ch_{0 \to N_{chunks}-1 \backslash 1}$ is provided as output.

In embodiments, after segmenting the LDPC codeword 102 into $N_{chunks}$ chunks 110_0 to 110_$N_{chunks}$-1, the first chunk 110_1 is separated while the remaining $N_{chunks}$-1 chunks 110_0, 110_2 to 110_$N_{chunks}$-1 can be concatenated back together. FIG. 7 depicts the concatenation process. The concatenator will take in $Ch_i, \forall i=0, \ldots, N_{chunks}-1, i \ne 1$ (i.e., the one or more other chunks 110_0, 110_2 to 110_$N_{chunks}$-1), and concatenate them into one composite vector $Ch_{0 \to N_{chunks}-1 \backslash 1}$ 111 of length $(N_{chunks}-1) \times N_{bits/chunk}$. The concatenated vector is given by:

$$Ch_{0 \to N_{chunks}-1 \backslash 1}(j+\max(i-1, 0) \times N_{bits/chunk})=Ch_i(j)$$

$$\forall i=0, \ldots, N_{chunks}-1, i \ne 1, j=0, \ldots, N_{bits/chunk}-1, \quad (2)$$

In embodiments, the concatenation stage 105 can be configured to concatenate the one or more other chunks 110_0, 110_2 to 110_$N_{chunks}$-1 of the plurality of chunks 110_0 to 110_$N_{chunks}$-1 based on the following syntax (e.g., by performing (e.g., running) the following pseudocode):

```
k = 0
for i = 0: N_chunks - 1
    if (i == 1)
        continue
    end
    for j = 0: N_bits/chunk - 1
        Ch_{0→N_chunks-1\1}(j + kN_bits/chunk) = Ch_i(j)
    end
    k = k + 1
end
``` wherein k represents a control variable, wherein i represents a control variable, wherein j represents a control variable, wherein $N_{chunks}$ represents a number of chunks the LDPC encoded bit sequence is segmented into, wherein $N_{bits/chunk}$ represents a number of bits per chunk, wherein $Ch_{0 \to N_{chunks}-1 \backslash 1}$ represents a concatenated version of the one or more other chunks, wherein $Ch_i$ represents each of the plurality of chunks.

1.3 Random Interleaver

In embodiments, the next step (=random interleaver step, e.g., performed by the first interleaver stage 106) is to randomly interleave the concatenated vector $Ch_{0 \to N_{chunks}-1 \backslash 1}$ 111. For that purpose, one possibility is to utilize a Linear Feedback Shift Register (LFSR) 107 in order to generate the pseudorandom indices. The number of registers $N_R$ of the deployed LFSR 107 has to satisfy the following inequality:

$$2^{N_R}-1 \ge (N_{chunks}-1) \times N_{bits/chunk} \quad (3)$$

For the (736,184) LDPC example, the concatenated vector $Ch_{0 \to 3 \backslash 1}$ 111 has $3 \times 184$ bits. This means that an LFSR 107 of at least $N_R=10$ registers may be used in order to provide unique permutation indices. Cyclic Redundancy Check (CRC) could be an efficient potential candidate for the initialization of such an LFSR 107. It is calculated by serially shifting the concatenated vector $Ch_{0 \to 3\backslash 1}$ 111 to the LFSR followed by $N_R$ zeros.

Figure 8:
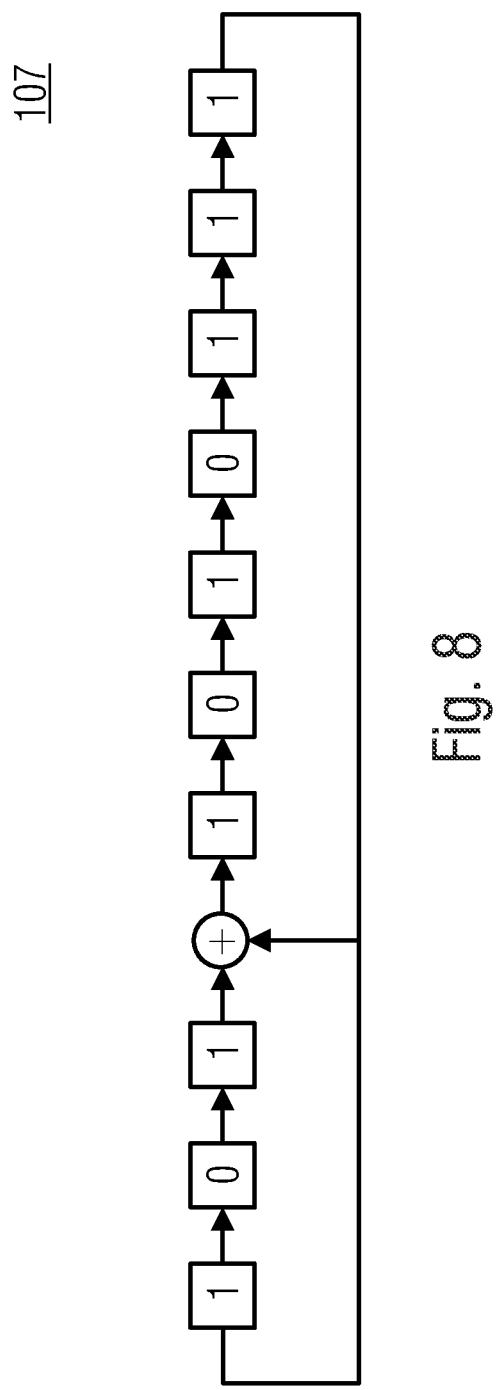
FIG. 8 shows a schematic block diagram of a 10-bit Galois linear feedback shift register (LFSR)

FIG. 8 gives an example of a 10-bit Galois LFSR 107 with generator polynomial $g(x)=x^{10}+x^7+1=0\times240$, and an initial state that corresponds to a checksum of 0×2D7. The LFSR 107 iterates through all the $2^{N_R}-1$ states excluding the all-zero state. The next state of such an LFSR is 0×32B which is equivalent to decimal index 811. This index value is greater than the number of permutation indices that may be used. Thus, the index is discarded and the LFSR proceeds to the next iteration.

Figure 9:
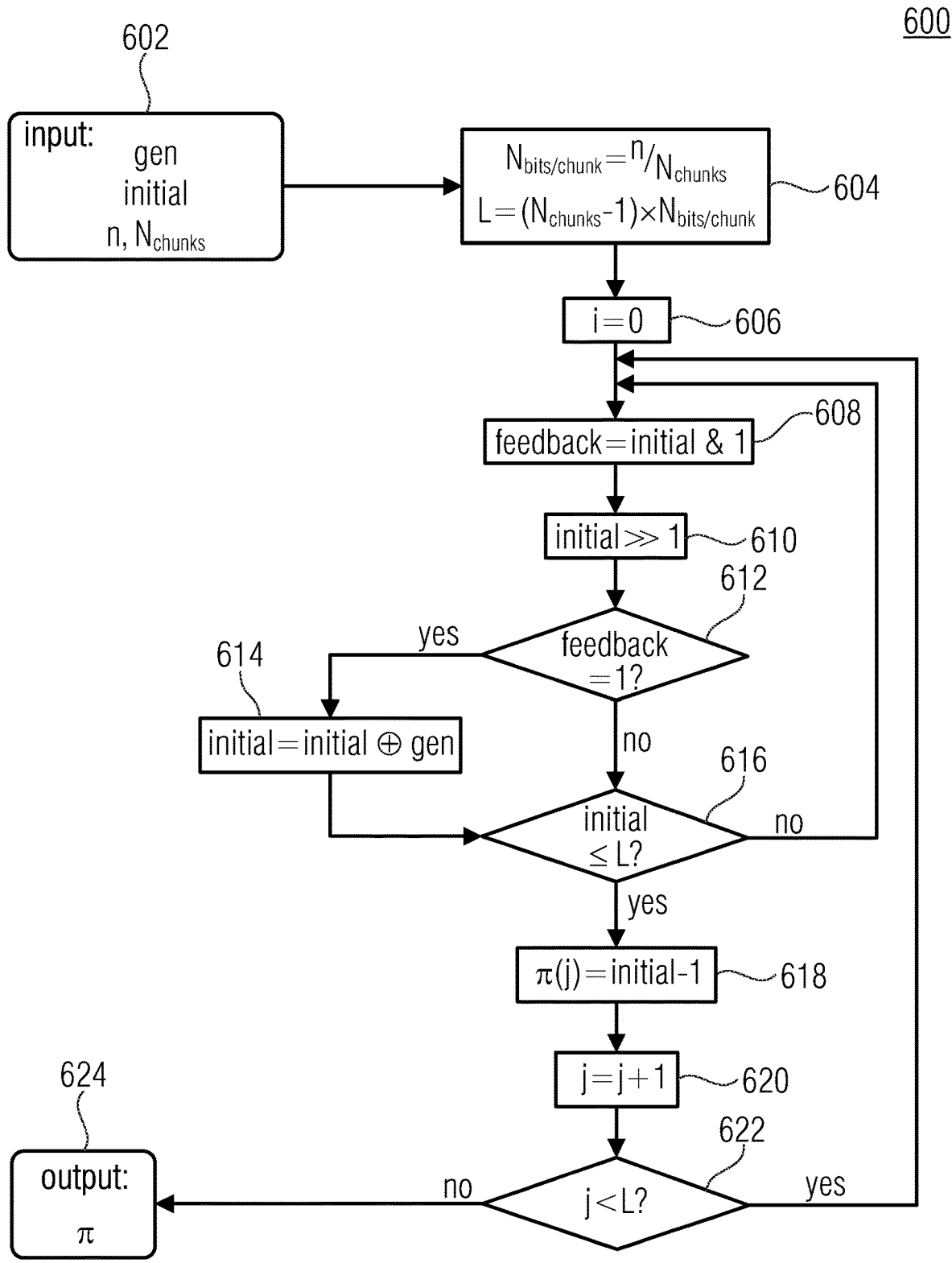
FIG. 9 shows a flowchart of a method for generating, based on an LFSR, a pseudorandom index, according to an embodiment of the present invention.

FIG. 9 shows a flowchart of a method 600 for generating, based on an LFSR, a pseudorandom index, according to an embodiment of the present invention.

In a first step 602, input is provided, wherein the input comprises a generator polynomial gen, an initial state initial of the LFSR, the number n of bits (e.g., information bits+ redundancy bits) of the LDPC encoded bit sequence, and the number $N_{chunks}$ of chunks the LDPC encoded bit sequence is to be segmented into.

In a second step 604, a number $N_{bits/chunk}$ of bits per chunk is determined based on the equation $N_{bits/chunk}=n/N_{chunks}$, and a length L of indices that may be used is determined based on the equation $L=(N_{chunks}-1)\times N_{bits/chunk}$.

In a third step 606, a control variable j is set to zero, j=0.

In a fourth step 608, a feedback of the LFSR is set to the initial state initial & one, feedback=initial & 1, i.e. the last bit (least significant bit) of the initial state is provided as feedback.

In a fifth step 610, the initial state initial of the LFSR is shifted one position to the right, initial>>1.

In a sixth step 612, it is checked if the feedback of the LFSR is equal to one, feedback=1, and if yes, it is continued with a seventh step 614, else it is continued with an eighth step 616.

In the seventh step 614, the initial state initial of the LFSR is XORed with the generator polynomial of the LFSR, to obtain a new initial state, initial=initial⊕gen.

In the eighth step 616, it is checked if the decimal equivalent of the initial state initial of the LFSR is equal to or smaller than the length L of indices that may be used, and if yes, it is continued with a ninth step 618, else it is continued with the fourth step 608.

In the ninth step 618, the permutation indices vector π at location j is set to initial minus one, π(j)=initial−1.

In a tenth step 620, the control variable j is increased by one, j=j+1.

In an eleventh step 622, it is checked if the control variable j is smaller than L, j<L, and if yes, it is continued with the fourth step 608, else it is continued with a twelfth step 624.

In the twelfth step 624, the permutation indices vector π is provided as output.

In other words, the flowchart of the pseudorandom index generator by means of LFSR 107 is shown in FIG. 9. The LFSR 107 is generated by a primitive generator polynomial of degree $N_R$, and initialized by the CRC checksum or by an arbitrary initial state within its $2^{N_R}-1$ cycle span. After every iteration, the LFSR exhibits a new state that corresponds to a candidate permutation index. This index has to be compared to the length of indices that may be used, $L=(N_{chunks}-1)\times N_{bits/chunk}$. If the generated index is less than L, it will be appended to the permutation indices vector π. Otherwise, the state is discarded, and the LFSR proceeds to the next state. The algorithm halts when the number of generated indices in π reaches L.

Figure 10:
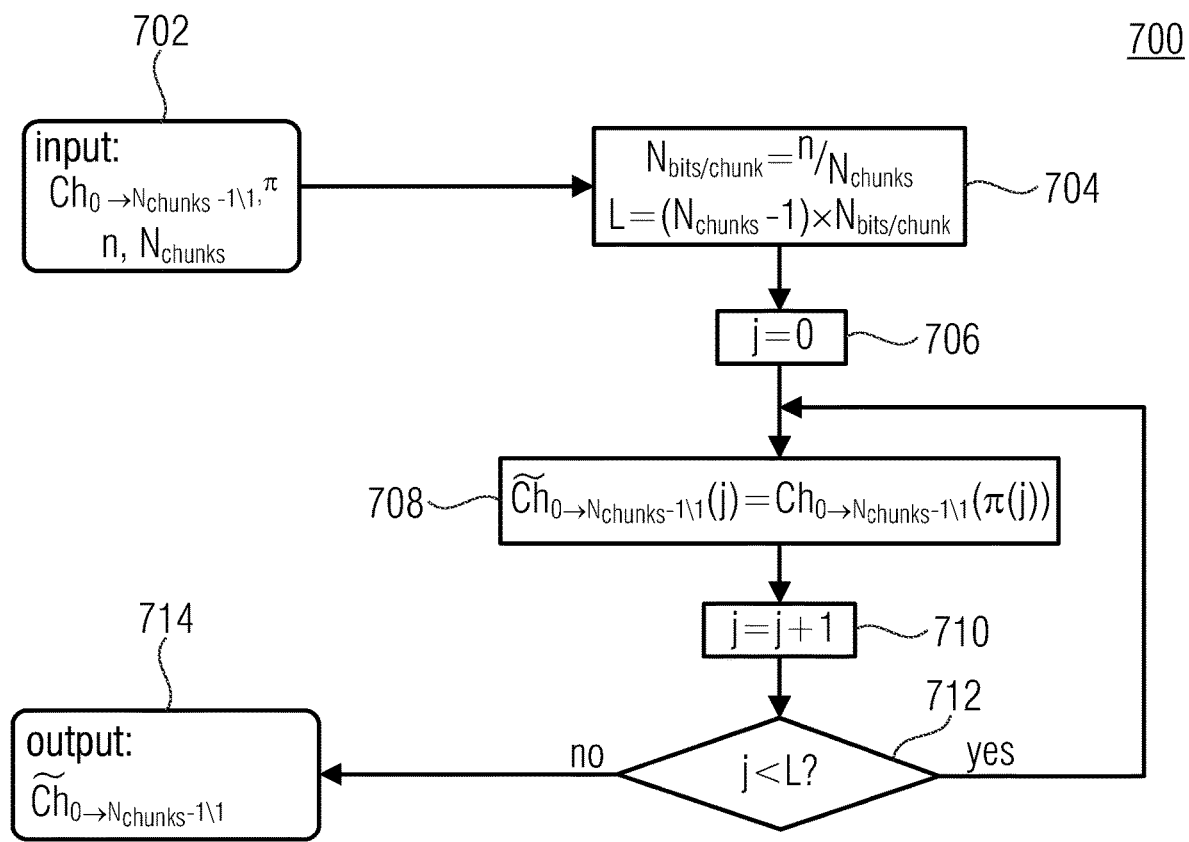
FIG. 10 shows a flowchart of method for random interleaving performed by the first interleaver stage, according to an embodiment of the present invention.

FIG. 10 shows a flowchart of method 700 for random interleaving performed by the first interleaver stage 106 (e.g., a LFSR random interleaver), according to an embodiment of the present invention. In a first step 702, input is provided, wherein the input comprises a concatenated version of the other chunks $Ch_{0 \to N_{chunks}-1\backslash 1}$, the permutation indices vector π, the number n of bits (e.g., information bits+redundancy bits) of the LDPC encoded bit sequence, and the number $N_{chunks}$ of chunks the LDPC encoded bit sequence is to be segmented into.

In a second step 704, a number $N_{bits/chunk}$ of bits per chunk are determined based on the equation $N_{bits/chunk}=n/N_{chunks}$, and a length L of indices that may be used is determined based on the equation $L=(N_{chunks}-1)\times N_{bits/chunk}$.

In a third step 706, a control variable j is set to zero, j=0.

In a fourth step 708, the other chunks $Ch_{0 \to N_{chunks}-1\backslash 1}$ are pseudo randomly interleaved based on the permutation indices vector π, to obtain an interleaved bit sequence $$\widetilde{Ch}_{0 \to N_{chunks}-1\backslash 1}$$

(e.g. an interleaved version of a concatenated version of the other chunks), $$\widetilde{Ch}_{0 \to N_{chunks}-1\backslash 1}(j) = Ch_{0 \to N_{chunks}-1\backslash 1}(\pi(j)).$$

In a fifth step 710, the control variable j is increased by one, j=j+1.

In a sixth step 712, it is checked if the control variable j is smaller than L, j<L, and if yes, it is continued with the fourth step 708, else it is continued with a seventh step 714.

In the seventh step 714, the interleaved bit sequence $$\widetilde{Ch}_{0 \to N_{chunks}-1\backslash 1}$$

is provided as output.

In embodiments, after the pseudorandom indices are generated, they can be used to permute the concatenated $(N_{chunks}-1)$-chunk vector $Ch_{0 \to N_{chunks}-1\backslash 1}$ (i.e., the concatenated version of the one or more other chunk 110_0, 110_2 to 110_$N_{chunks}$−1). The random interleaver 106 takes in both the permutation vector π, and the concatenated vector $Ch_{0 \to N_{chunks}-1\backslash 1}$ 111. It produces an interleaved vector $$\widetilde{Ch}_{0 \to N_{chunks}-1\backslash 1}$$

112 of the same length as $Ch_{0 \to N_{chunks}-1\backslash 1}$. The mapping of elements from $Ch_{0 \to N_{chunks}-1\backslash 1}$ to $$\widetilde{Ch}_{0 \to N_{chunks}-1\backslash 1}$$

is done according to the permutation indices in π such that:

$$\widetilde{Ch}_{0 \to N_{chunks}-1\backslash 1}(j) = Ch_{0 \to N_{chunks}-1\backslash 1}(\pi(j)) \forall j = 0, \ldots, L-1, \quad (4)$$

where $L=(N_{chunks}-1) \times N_{bits/chunk}$, is the length of the concatenated vector. The random interleaving process is illustrated in FIG. 10.

In embodiments, the first interleaver stage 106 can be configured to interleave the concatenated version of the other chunks 110_0, 110_2 to 110_$N_{chunks}$-1 of the plurality of chunks 110_0 to 110_$N_{chunks}$-1 based on the following syntax (e.g., by performing (e.g., running) the following pseudocode):

$$\text{for } j = 0:\ ((N_{chunks} - 1)N_{bits/chunk}) - 1$$
$$\widetilde{Ch}_{0 \to N_{chunks}-1 \backslash 1}(j) = Ch_{0 \to N_{chunks}-1 \backslash 1}(\pi(j))$$
end wherein j represents a control variable, wherein $N_{chunks}$ represents a number of chunks the LDPC encoded bit sequence is segmented into, wherein $N_{bits/chunk}$ represents a number of bits per chunk, wherein $$\widetilde{Ch}_{0 \to N_{chunks}-1 \backslash 1}$$

represents the interleaved bit sequence (e.g., an interleaved version of (a concatenated version) of the one or more other chunks), wherein $Ch_{0 \to N_{chunks}-1 \backslash 1}$ represents a concatenated version of the one or more other chunks, wherein $\pi$ represents a permutation indices vector of a linear feedback shift register.

1.4 Block-Wise Interleaver

Figure 11:
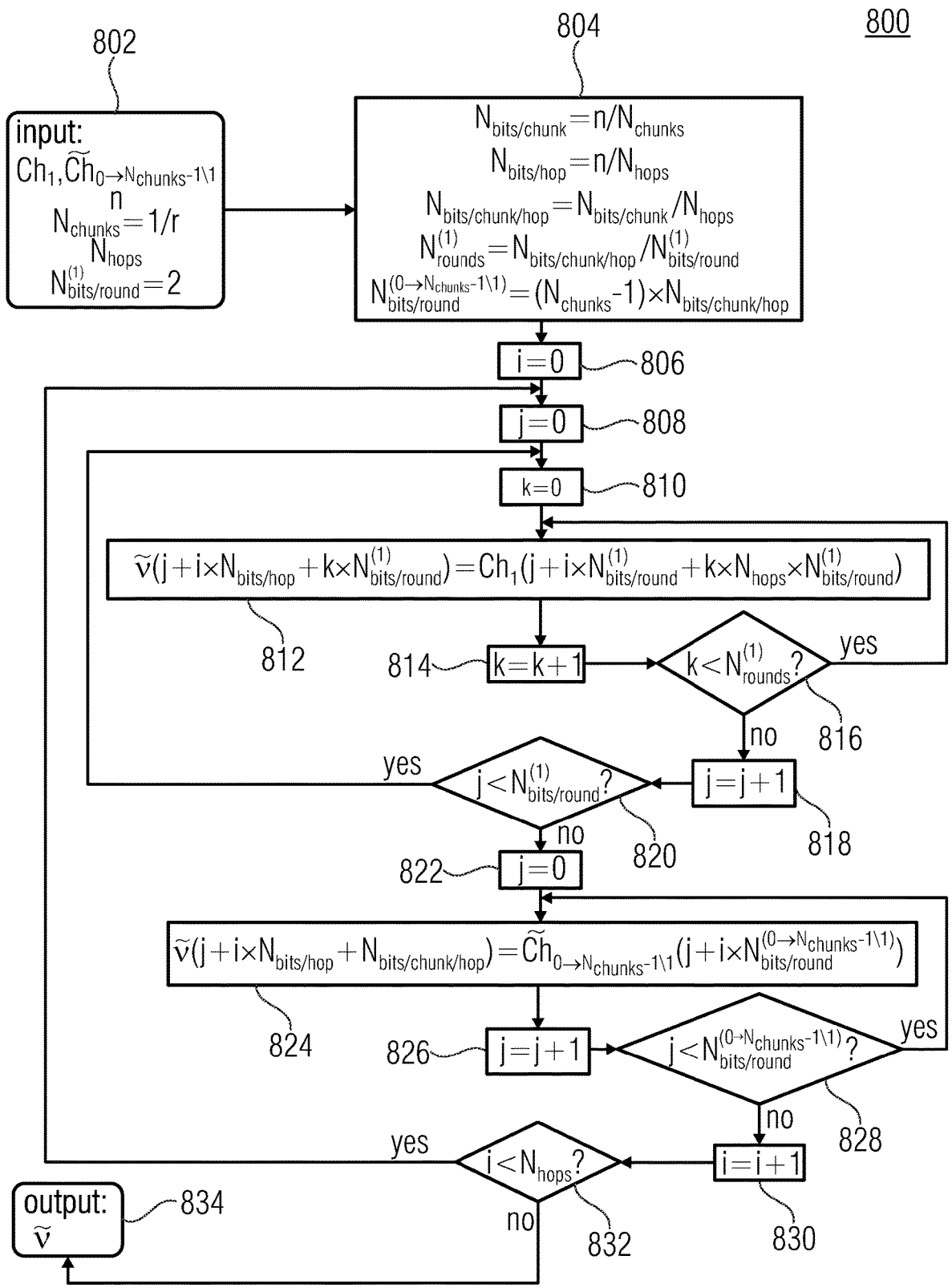
FIG. 11 shows a flowchart of a method for block-wise interleaving performed by the second interleaver stage, according to an embodiment of the present invention.

FIG. 11 shows a flowchart of a method 800 for block-wise interleaving performed by the second interleaver stage 108, according to an embodiment of the present invention. In a first step 802, input is provided, wherein the input comprises the first chunk $Ch_1$, the interleaved bit sequence $$\widetilde{Ch}_{0 \to N_{chunks}-1 \backslash 1},$$

the number n of bits (e.g. information bits+redundancy bits) of the LDPC encoded bit sequence, the number $N_{chunks}$ of chunks the LDPC encoded bit sequence is segmented into, which is equal to 1/r, the number $N_{hops}$ of sub-data packets over which the interleaved version of the LDPC encoded bit sequence is to be distributed, and a number $N_{bits/round}^{(1)}$ of bits per round which are taken from the first chunk and are distributed over the plurality of sub-data packets.

In a second step 804, a number N bits/chunk of bits per chunk are determined based on the equation $N_{bits/chunk}=n/N_{chunks}$, a number N bits/hop of bits per sub-data packet is determined based on the equation N bits/hop=$n/N_{hops}$, a number $N_{bits/chunk/hop}$ of bits per chunk per sub-data packet is determined based on the equation $N_{bits/chunk/hop}=N_{bits/chunk}/N_{hops}$, a number $N_{rounds}^{(1)}$ of rounds that may be used to distribute the bits of the first chunk is determined based on the equation $N_{rounds}^{(1)}=N_{bits/chunk/hop}/N_{bits/round}^{(1)}$, and a number $N_{bits/round}^{(0 \to N_{chunks}-1 \backslash 1)}$ of bits per round which are taken from the other chunks and are distributed over the plurality of sub-data packets is determined based on the equation $N_{bits/round}^{(0 \to N_{chunks}-1 \backslash 1)}=(N_{chunks}-1) \times N_{bits/chunk/hop}$.

In a third step 806, a control variable i is set to zero, i=0.
In a fourth step 808, a control variable j is set to zero, j=0.
In a fifth step 810, a control variable k is set to zero, k=0.

In a sixth step 812, bits of the first chunk $Ch_1$ are mapped to the interleaved version $\tilde{v}$ of the LDPC encoded bit sequence based on the equation $\tilde{v}(j+i \times N_{bits/hop}+k \times N_{bits/round}^{(1)})=Ch_1(j+i \times N_{bits/round}^{(1)}+k \times N_{hops} \times N_{bits/round}^{(1)})$.

In a seventh step 814, the control variable k is increased by one, k=k+1.

In an eight step 816, it is checked if k is smaller than the determined number $N_{rounds}^{(1)}$ of rounds that may be used to distribute the bits of the first chunk, k<$N_{rounds}^{(1)}$, and if yes, it is continued with the sixth step 812, else it is continued with a ninth step 818.

In the ninth step 818, the control variable j is increased by one, j=j+1.

In a tenth step 820, it is checked if j is smaller than number $N_{bits/round}^{(1)}$ of bits per round which are taken from the first chunk and are distributed over the plurality of sub-data packets, j<$N_{bits/round}^{(1)}$, and if yes, it is continued with the fifth step 810, else it is continued with an eleventh step 822.

In the eleventh step 822, the control variable j is set to zero, j=0.

In a twelfth step 824, the interleaved bits sequence $$\widetilde{Ch}_{0 \to N_{chunks}-1 \backslash 1}$$

is mapped to the interleaved version $\tilde{v}$ of the LDPC encoded bit sequence based on the equation $$\tilde{v}(j + i \times N_{bits/hop} + N_{bits/chunk/hop}) = \widetilde{Ch}_{0 \to N_{chunks}-1 \backslash 1}\left(j + i \times N_{bits/round}^{(0 \to N_{chunks}-1 \backslash 1)}\right).$$

In a thirteenth step 826, the control variable j is increased by one, j=j+1.

In a fourteenth step 828, it is checked if the control variable j is smaller than the determined number $N_{bits/round}^{(0 \to N_{chunks}-1 \backslash 1)}$ of bits per round which are taken from the other chunks and are distributed over the plurality of sub-data packets, j<$N_{bits/round}^{(0 \to N_{chunks}-1 \backslash 1)}$, and if yes, it is continued with the twelfth step 824, else it is continued with a fifteenth step 830.

In the fifteenth step 830, the control variable i is increased by one, i=i+1.

In a sixteenth step 832, it is checked if the control variable i is smaller than the number $N_{hops}$ of sub-data packets over which the interleaved version of the LDPC encoded bit sequence is to be distributed, and if yes, it is continued with the fourth step 808, else it is continued with a seventeenth step 834.

In the seventeenth step 834, the interleaved version i of the LDPC encoded bit sequence is provided as output.

In embodiments, the final step (=second interleaving step, e.g., performed by the second interleaver stage 108) involves the interleaving of the extracted chunk $Ch_1$ (i.e., the first chunk 110_1) along with the randomly interleaved vector $$\widetilde{Ch}_{0 \to N_{chunks}-1 \backslash 1}$$

(i.e., the interleaved bit sequence 112), in a block-wise fashion. The idea is to evenly distribute the encoded bits over the transmitted hops 120_1 to 120_$N_{hops}$-1. Each hop comprises bits from (the first chunk 110_1) $Ch_1$ and (the other chunks 110_0, 110_2 to 110_N$_{chunks}$-1)

$$\widetilde{Ch}_{0 \rightarrow N_{chunks}-1 \backslash 1}$$

with a ratio of $1:N_{chunks}-1$, respectively. This means that, if the n data bits are to be transmitted over $N_{hops}$ with $N_{bits/hop}=n/N_{hops}$, $1/N_{chunks}$ of the bits would be taken from (the first chunk 110_1) $Ch_1$ while the remaining $(N_{chunks}-1)/N_{chunks}$ should be taken from (the other chunks 110_0, 110_2 to 110_N$_{chunks}$-1)

$$\widetilde{Ch}_{0 \rightarrow N_{chunks}-1 \backslash 1}.$$

Furthermore, the bits of (the first chunk 110_1) $Ch_1$ that are mapped on each hop should be taken in a hop-wise cyclic manner with $N_{bits/round}^{(1)}=2$. This means that, the first two bits of (the first chunk 110_1) $Ch_1$ are mapped onto the first hop 120_0.

The next two bits are placed on the second hop 120_1, and so on. After $N_{hops}$, another round starts by mapping two bits of (the first chunk 110_1) $Ch_1$ on each hop. All the $N_{bits/chunk}$ bits of (the first chunk 110_1) $Ch_1$, are completely mapped onto the $N_{hops}$ after $N_{rounds}^{(1)}=n/(N_{chunks} \times N_{hops} \times N_{bits/round}^{(1)})$. Finally, the bits of the interleaved $$\widetilde{Ch}_{0 \rightarrow N_{chunks}-1 \backslash 1}$$

vector 112 are mapped onto the hops 120_0 to 120_N$_{hops}$-1 over one round, where a round comprises $N_{bits/round}^{(0 \rightarrow N_{chunks}-1 \backslash 1)}=(N_{chunks}-1) \times N_{bits/chunk/hop}=((N_{chunks}-1) \times N_{bits/chunk})/N_{hops}$ bits on each hop.

The flowchart of the block-wise random interleaver is shown in FIG. 11. Both (the first chunk 110_1) $Ch_1$ and (the interleaved bit sequence 112)

$$\widetilde{Ch}_{0 \rightarrow N_{chunks}-1 \backslash 1}$$

are fed to the interleaver 108 producing an output vector $\tilde{v}$ 116, that corresponds to the interleaved version of the LDPC coded vector v 102. The interleaver 108 loops over the $N_{hops}$ assigning $N_{bits/hop}$ bits for each hop. It first starts by mapping $N_{bits/round}^{(1)}=2$ bits, from (the first chunk 110_1) $Ch_1$ onto each hop over $N_{rounds}^{(1)}$ rounds. This can be represented by:

$$\tilde{v}(j+i \times N_{bits/hop}+k \times N_{bits/round}^{(1)})=Ch_1(j+i \times N_{bits/round}^{(1)}+k \times N_{hops} \times N_{bits/round}^{(1)}), \quad (5)$$

where
$N_{hops}$ is the number of hops,
$N_{bits/hop}=n/N_{hops}$, is the number of transmitted bits over each hop,
$N_{bits/round}^{(1)}=2$, is the number of bits mapped from $Ch_1$ on each hop every round,
$N_{rounds}^{(1)}$ is the total number of rounds that may be used to exhaust all the bits of $Ch_1$, $i=0, \ldots, N_{hops}-1$, is the hop index,
$j=0, \ldots, N_{bits/round}^{(1)}-1$, is the bit index within the round, and
$k=0, \ldots, N_{rounds}^{(1)}-1$, is the round index After $N_{rounds}^{(1)}$, each hop will have $N_{rounds}^{(1)} \times N_{bits/round}^{(1)}$ from (the first chunk 110_1) $Ch_1$. The rest of the $N_{bits/hop}$ bits on each hop should be taken from (the interleaved bit sequence 112)

$$\widetilde{Ch}_{0 \rightarrow N_{chunks}-1 \backslash 1}.$$

Because (the interleaved bit sequence 112)

$$\widetilde{Ch}_{0 \rightarrow N_{chunks}-1 \backslash 1}$$

is already pseudo-randomly interleaved, the bits will be distributed on the hops 120_1 to 120_N$_{hops}$-1 over one round (i.e. $N_{rounds}^{(0 \rightarrow N_{chunks}-1 \backslash 1)}$). This means that, for each hop $N_{bits/round}^{(0 \rightarrow N_{chunks}-1 \backslash 1)}=(N_{chunks}-1) \times N_{bits/chunk}/N_{hops}$ bits should be taken serially from (the interleaved bit sequence 112)

$$\widetilde{Ch}_{0 \rightarrow N_{chunks}-1 \backslash 1}.$$

This can be described by:

$$\tilde{v}(j+i \times N_{bits/hop}+N_{bits/chunk/hop})= \widetilde{Ch}_{0 \rightarrow N_{chunks}-1 \backslash 1}(j+i \times N_{bits/round}^{(0 \rightarrow N_{chunks}-1 \backslash 1)}), \quad (6)$$

where,
$N_{bits/chunk/hop}=N_{bits/chunk}/N_{hops}$, is approximately the number of transmitted bits from every chunk over each hop,
$N_{bits/round}^{(0 \rightarrow N_{chunks}-1 \backslash 1)}=(N_{chunks}-1) \times N_{bits/chunk/hop}$, is the number of bits mapped from $$\widetilde{Ch}_{0 \rightarrow N_{chunks}-1 \backslash 1}$$

on each hop,
$i=0, \ldots, N_{hops}-1$, is the hop index, and
$j=0, \ldots, N_{bits/round}^{(0 \rightarrow N_{chunks}-1 \backslash 1)}-1$, is the bit index within $$\widetilde{Ch}_{0 \rightarrow N_{chunks}-1 \backslash 1}$$

In embodiments, the second interleaver stage 108 can be configured to interleave the first chunk 110_1 and the interleaved bit sequence 112 based on the following syntax, e.g., by performing (e.g., running) the following pseudo-code):

```
for i = 0: N_hops - 1
    for j = 0: N_bits/round^(1) - 1
```

-continued

```
for k = 0: N_rounds^(1) - 1
    ṽ(j + iN_bits/hop + kN_bits/round^(1)) = Ch_1(j + iN_bits/round^(1) + kN_hops N_bits/round^(1))
    end
end
for j = 0: N_bits/round^(0→N_chunks−1\1) − 1
    ṽ(j + iN_bits/hop + N_bits/chunk/hop) = C̃h_{0→N_chunks−1\1} (j + iN_bits/round^(0→N_chunks−1\1))
    end
end
Ouptut: ṽ
``` wherein i represents a control variable, wherein j represents a control variable, wherein k represents a control variable, wherein $N_{chunks}$ represents a number of chunks the LDPC encoded bit sequence is segmented into, wherein $N_{hops}$ represents a number of sub-data packets over which the interleaved version of the LDPC encoded bit sequence is distributed, wherein $N_{bits/round}^{(1)}$ represents a number of bits per round which are taken from the first chunk and are distributed over the plurality of sub-data packets, wherein $N_{bits/hop}$ represents a number of bits per sub-data packet, wherein ṽ represents the interleaved version of the LDPC encoded bit sequence, wherein $Ch_1$ represents the first chunk, wherein $$\widetilde{Ch}_{0 \to N_{chunks}-1\backslash 1}$$

represents the interleaved bit sequence (e.g., an interleaved version of (a concatenated version) of the one or more other chunks).

2. De-Interleaver

Figure 12:
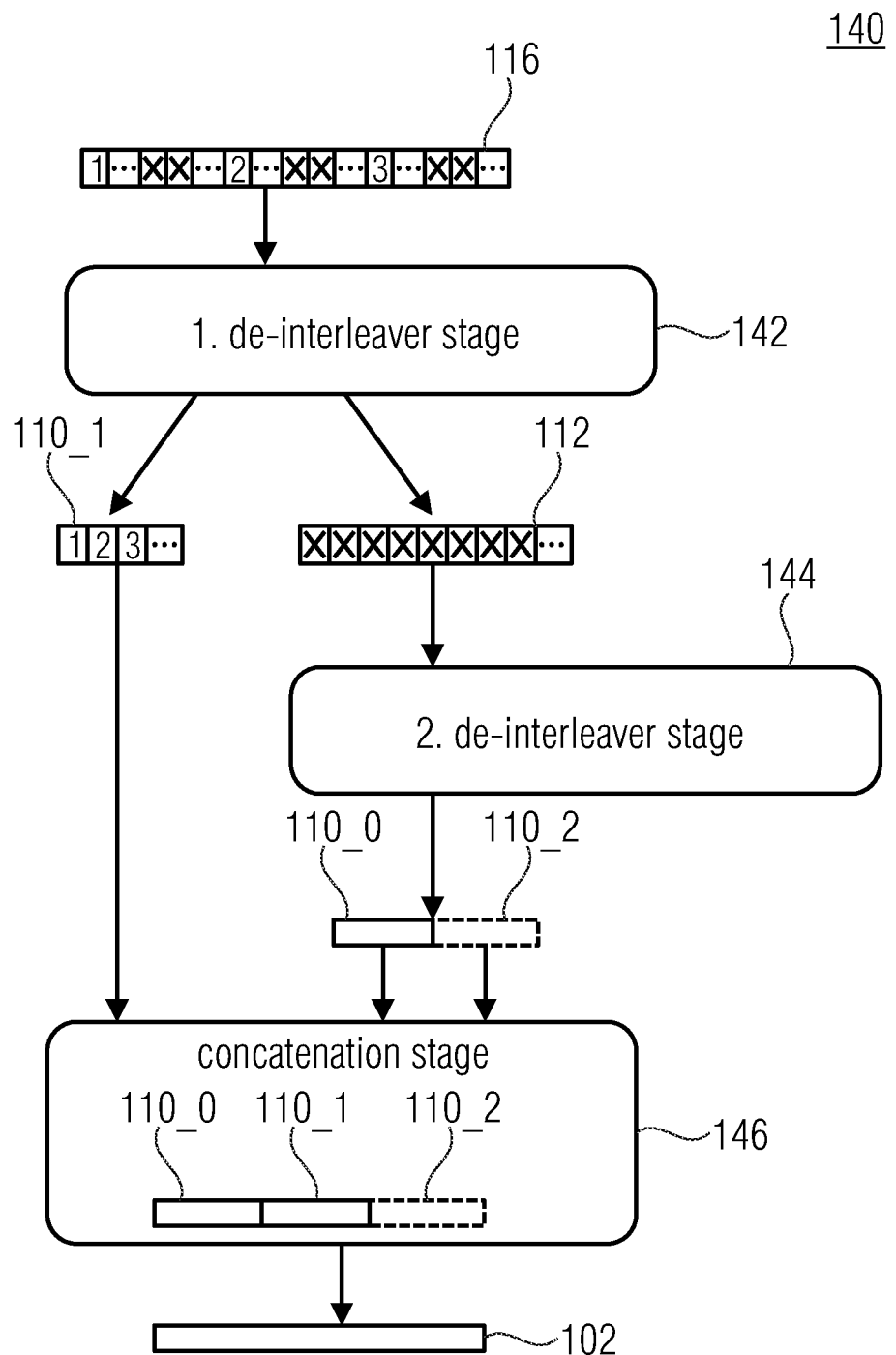
FIG. 12 shows a schematic block diagram of a de-interleaver for de-interleaving an interleaved version of an LDPC encoded bit sequence, according to an embodiment of the present invention.

FIG. 12 shows a schematic block diagram of a de-interleaver 140 for de-interleaving an interleaved version of an LDPC encoded bit sequence, according to an embodiment of the present invention. The de-interleaver 140 comprises a first de-interleaver stage 142, a second de-interleaver stage 144 and a concatenation stage 146.

The first de-interleaver stage 142 can be configured to block-wise de-interleave an interleaved version 116 of the LDPC encoded bit sequence, to obtain a first chunk 110_1 and an interleaved bit sequence 112, such as an interleaved version of one or more other chunks or of a concatenated version of two or more other chunks.

Thereby, the first chunk 110_1 consists of (e.g., only comprises) bits of a first type, wherein the bits of the first type are at least one out of
error correcting bits of the LDPC encoded bit sequence,
repeat accumulate bits of the LDPC encoded bit sequence,
represented, in a Tanner graph representation of the LDPC encoded bit sequence, by variable nodes that comprise non-random connections to at least two error correcting check nodes (e.g., each of the variable nodes being connected to two consecutive check nodes).

The second de-interleaver stage 144 can be configured to de-interleave the interleaved bit sequence 112, to obtain one or more other chunks, such as a zero-th chunk 110_0 and optionally a second chunk 110_2.

The concatenation stage 146 can be configured to concatenate the first chunk 110_1 and the one or more other chunks, such as the zero-th chunk 110_0 and optionally the second chunk 110_2, to obtain the LDPC encoded bit sequence 102.

As shown in FIG. 12, the first chunk 110_1 bypasses the second de-interleaver stage 144, or in other words, the first chunk 110_1 is not de-interleaved by the second de-interleaver stage 144.

In embodiments, one chunk of the one or more other chunks, such as the zero-th chunk 110_0, consist of bits of a second type, wherein the bits of the second type are at least one out of
information bits of the LDPC encoded bit sequence, and/or
represented, in a Tanner graph representation of the LDPC encoded bit sequence, by variable nodes that comprise pseudo random connections to error correcting check nodes.

In embodiments, another chunk of the other chunks, such as the second chunk 110_2, consist of (e.g., only comprises) bits of the first type, i.e. at least one out of
error correcting bits of the LDPC encoded bit sequence 102,
repeat accumulate bits of the LDPC encoded bit sequence 102,
represented, in a Tanner graph representation of the LDPC encoded bit sequence 102, by variable nodes that comprise non-random connections to at least two error correcting check nodes (e.g., each of the variable nodes being connected to two consecutive check nodes).

In embodiments, the first de-interleaver stage 142 can be a block-wise de-interleaver. For example, the first de-interleaver stage 142 can be complementary to the second interleaver stage 108 (see FIG. 2).

In embodiments, the second de-interleaver stage 144 can be a pseudorandom de-interleaver, such as a linear feedback shift register based de-interleaver or a block-wise de-interleaver.

3. Iterative Decoder

Figure 13:
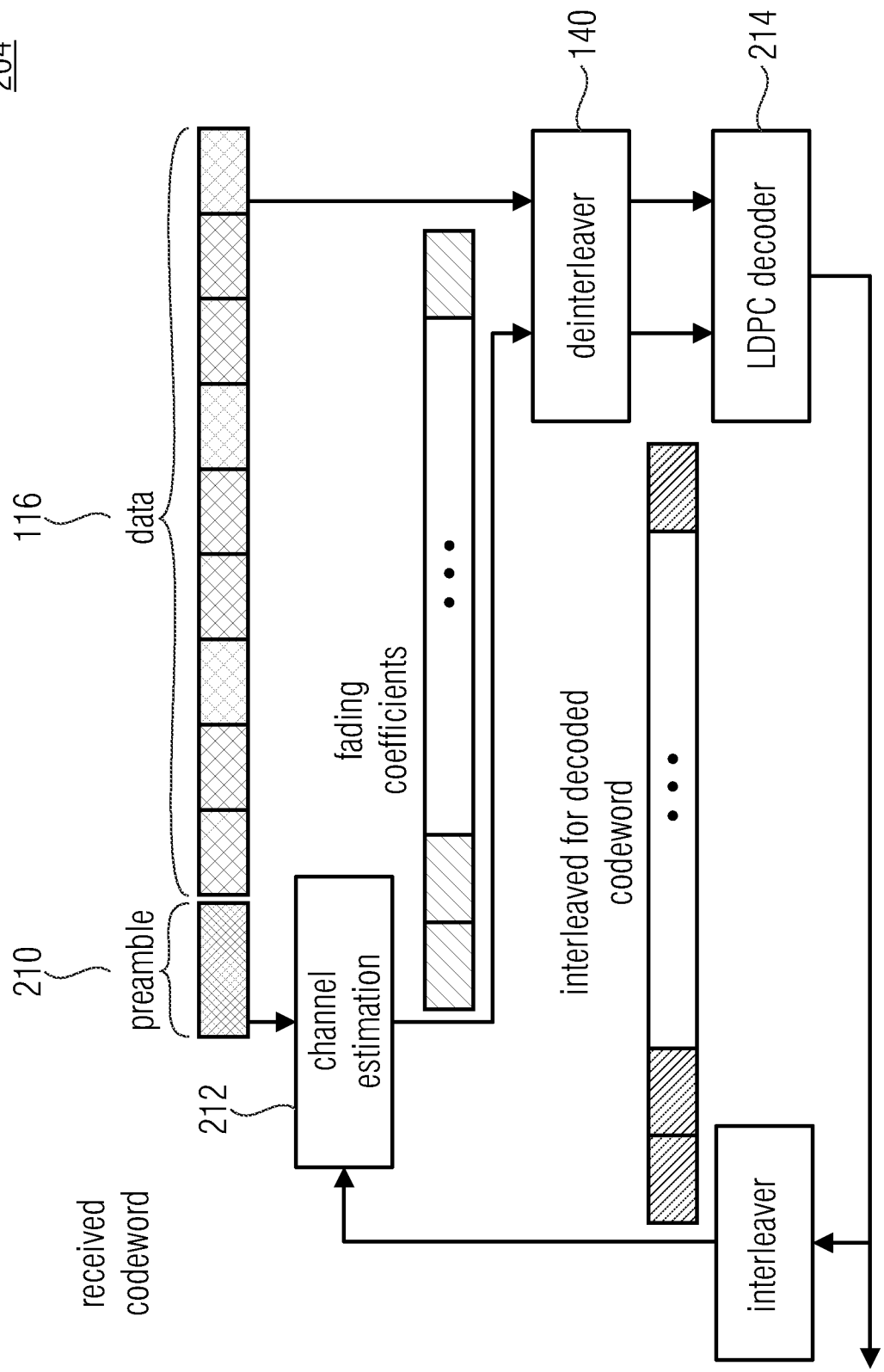
FIG. 13 shows a schematic block diagram of an iterative decoder, according to an embodiment of the present invention.

FIG. 13 shows a schematic block diagram of an iterative decoder, according to an embodiment of the present invention. The iterative decoder 204 comprises a channel estimator, the above described de-interleaver 140, an LDPC decoder 214 and the above described interleaver 100.

In other words, FIG. 11 depicts the block diagram of the iterative decoder 204 of the interleaved LDPC codeword 116. A received signal at the receiver side is composed of a faded version of the transmitted signal that comprises a preamble 210 and an interleaved LDPC codeword 116. The preamble 210 is fed to the channel estimator 212, which in return produces an estimate of the first $D_L$ fading coefficients. The remaining $n-D_L$ coefficients remain vague. Both, the received codeword 116 and the partially estimated fading vector are deinterleaved (e.g., by the de-interleaver 140) and fed to the LDPC decoder 214, which calculates the apriori LLRs of the symbols corresponding to the estimated coefficients, while treating the remaining symbols as erasures. These apriori LLRs trigger the Belief Propagation decoding of the LDPC.

Because the staircase structure of the LDPC codeword 102 is broken down by the interleaver 100, the LDPC decoder 214 can still be triggered even with only $D_L$ available estimated fading coefficients. This results in a preliminary decoded vector that serves as an extra pilot signal for the channel estimation 212. Another decoding iteration is then triggered by interleaving the partially decoded vector and passing it back along with the original preamble to the channel estimator 212. As a result, a longer chunk of $2D_L$ fading coefficients can then be estimated. The newly estimated fading vector is deinterleaved one more time and passed to the LDPC decoder 214 enabling it to decode a bigger chunk of the received codeword. This process is repeated iteratively till all the n bits of the received codeword are decoded.

Figure 14:
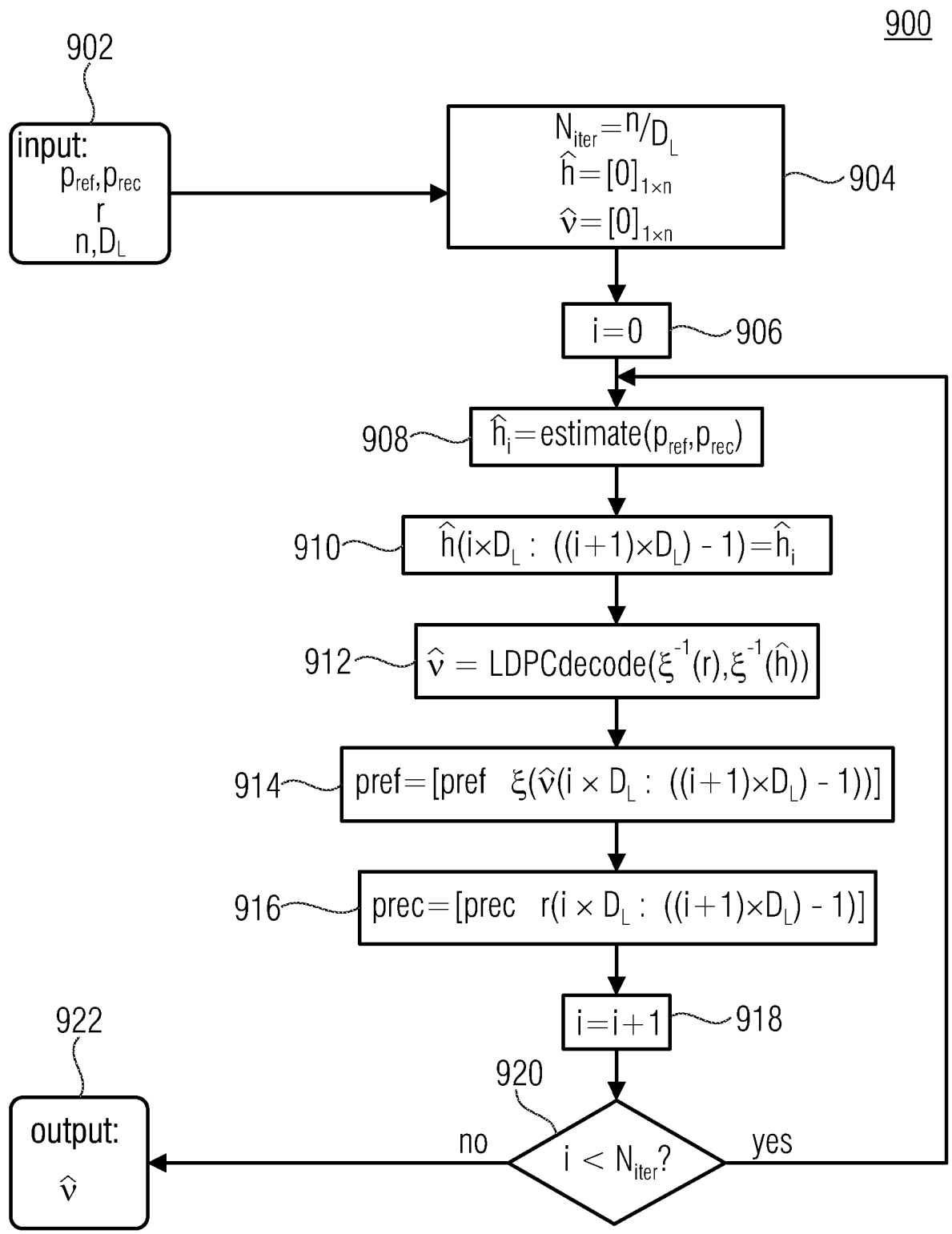
FIG. 14 shows a flowchart of a decoding method, according to an embodiment of the present invention.

FIG. 14 shows a flowchart of a decoding method 900, according to an embodiment of the present invention.

In a first step 902, input is provided, wherein the input comprises the reference pilot sequence (e.g., preamble) $p_{ref}$, the received pilot sequence (e.g., preamble) $p_{rec}$, the code rate r, the number n of bits (e.g., information bits+redundancy bits) of the LDPC encoded bit sequence, and the number $D_L$ of estimated coefficients at iteration i,∀i=0, . . . , $N_{iter}$−1.

In a second step 904, a number $N_{iter}$ of iterations is determined based on the equation $N_{iter}$=n/$D_L$, the fading estimate vector ĥ is initialized to zero, ĥ=$[0]_{1 \times n}$, the decoded codeword v̂ is initialized to zero, v̂=$[0]_{1 \times n}$.

In a third step 906, a control variable i is set to zero, i=0.

In a fourth step 908, the fading estimate vector $ĥ_i$ is estimated based on the equation $ĥ_i$=estimate ($p_{ref}$,$p_{rec}$).

In a fifth step 910, the fading estimate vector ĥ is updated so as to include $ĥ_i$, such that ĥ(i×$D_L$: ((i+1)×$D_L$)−1)=$ĥ_i$.

In a sixth step 912, both ĥ and r are deinterleaved and fed to the LDPC decoder, wherein the LDPC decoder first calculates the apriori LLRs and then triggers the Belief Propagation algorithm in an attempt to partially decode the received codeword, v̂=LDPCdecode($\xi^{-1}$(r), $\xi^{-1}$(ĥ)).

In a seventh step 914, the reference preamble is updated to include the interleaved decoded LDPC chunk, $$p_{ref}=[p_{ref}\xi(v̂)(i \times D_L:((i+1) \times D_L)-1))].$$

In an eight step 916, the received version of the reference preamble is updated to include the faded received version of the decoded LDPC chunk, $p_{rec}=[p_{rec}r(i \times D_L:((i+1) \times D_L)-1)]$.

In a ninth step 918, the control variable i is increased by one, i=i+1.

In a tenth step 920, it is checked if the control variable i smaller than the determined number $N_{iter}$ of iterations, and if yes, it is continued with the fourth step 908, else it is continued with an eleventh step 922.

In the eleventh step 922, the decoded codeword v̂ is provided as output.

In other words, a detailed description of the decoding mechanism is illustrated in FIG. 14. At the first decoding iteration, the preamble is initialized to the received preamble sequence, and both the fading estimate vector ĥ, and the decoded codeword v̂, are initialized to zero. Let $ĥ_i$ denote the vector of $D_L$ estimated coefficients at iteration i,∀i=0, . . . , $N_{iter}$−1, where $N_{iter}$ is the number of decoding iterations. The estimation vector ĥ is updated so as to include $ĥ_i$, such that:

$$ĥ(i \times D_L:((i+1) \times D_L)-1)=ĥ_i \qquad (7)$$

After that, both ĥ and r are deinterleaved and fed to the LDPC decoder 214. The decoder first calculates the apriori LLRs and then triggers the Belief Propagation algorithm in an attempt to partially decode the received codeword.

After every iteration, both the reference preamble and the received version of it are updated to include the interleaved decoded LDPC chunk and its faded received version, respectively. This can be described by:

$$p_{ref}=[p_{ref}\xi(v̂(i \times D_L:((i+1) \times D_L)-1))], \qquad (8)$$

$$p_{rec}=[p_{rec} r(i \times D_L:((i+1) \times D_L)-1))], \qquad (9)$$

where $\xi(x)$, $\xi^{-1}(x)$ correspond to the interleaved, and deinterleaved versions, respectively, of vector x, $\xi$(x (a:b)), $\xi^{-1}$(x (a:b)) correspond to the values of the $a^{th}$ to the $b^{th}$ indices, of the interleaved and deinterleaved versions of x, respectively.

$p_{ref}$ and $p_{rec}$ denote the reference and the received preamble, respectively.

3. Further Embodiments

Figure 15:
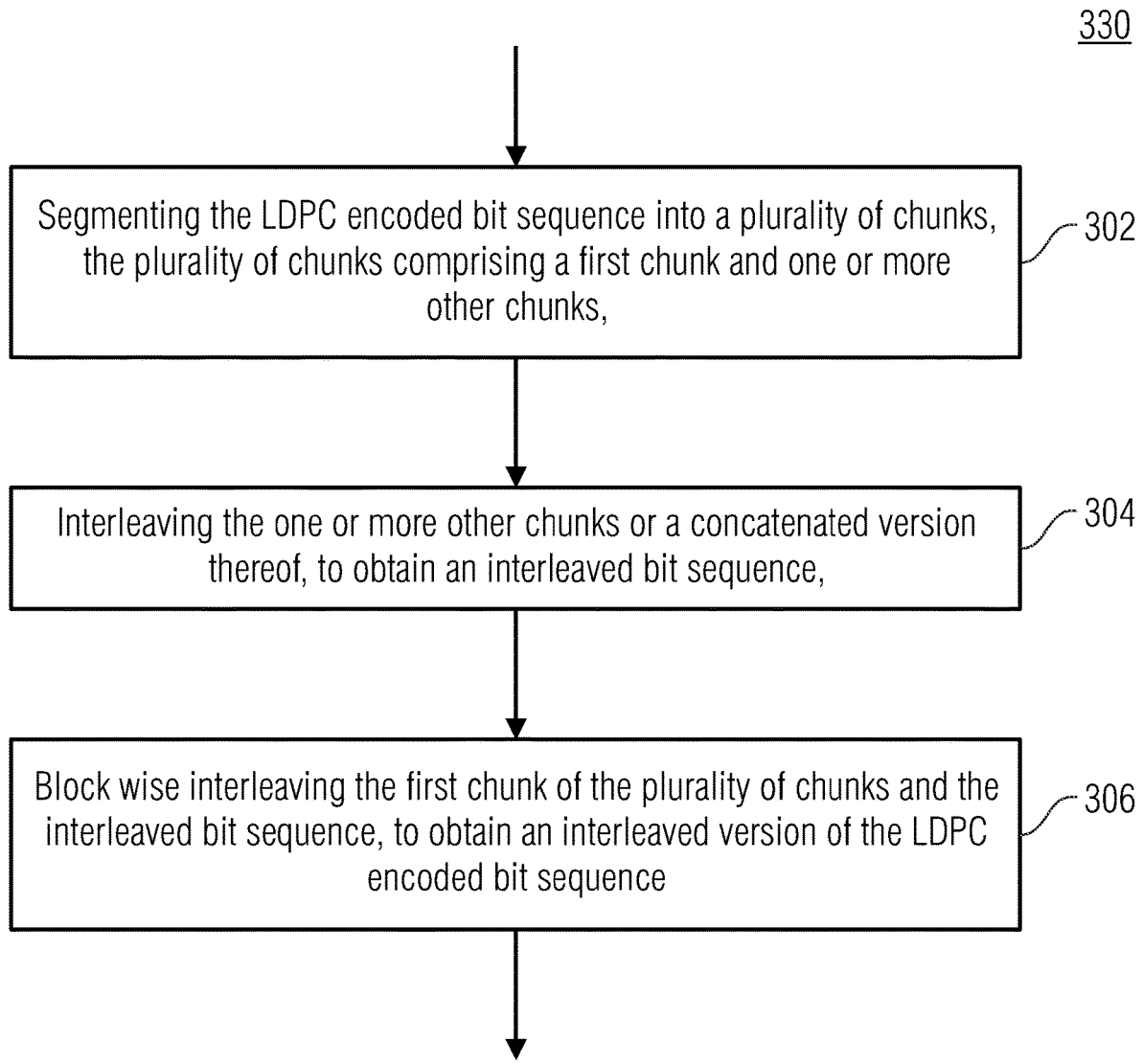
FIG. 15 shows a flowchart of a method for interleaving an LDPC encoded bit sequence, according to an embodiment of the present invention.

FIG. 15 shows a flowchart of a method 300 for interleaving an LDPC encoded bit sequence, according to an embodiment of the present invention. The method 300 comprises a step 302 of segmenting the LDPC encoded bit sequence into a plurality of chunks, the plurality of chunks comprising a first chunk and one or more other chunks, wherein the first chunk of the plurality of chunks consists bits of a first type, wherein the bits of the first type
- are error correcting bits of the LDPC encoded bit sequence,
- are repeat accumulate bits of the LDPC encoded bit sequence, and/or
- are represented, in a Tanner graph representation of the LDPC encoded bit sequence, by variable nodes that comprise non-random connections to at least two error correcting check nodes.

Further, the method 300 comprises a step 304 of interleaving the one or more other chunks or a concatenated version thereof, to obtain an interleaved bit sequence. Further, the method 300 comprises a step 303 of block-wise interleaving the first chunk of the plurality of chunks and the interleaved bit sequence, to obtain an interleaved version of the LDPC encoded bit sequence.

Figure 16:
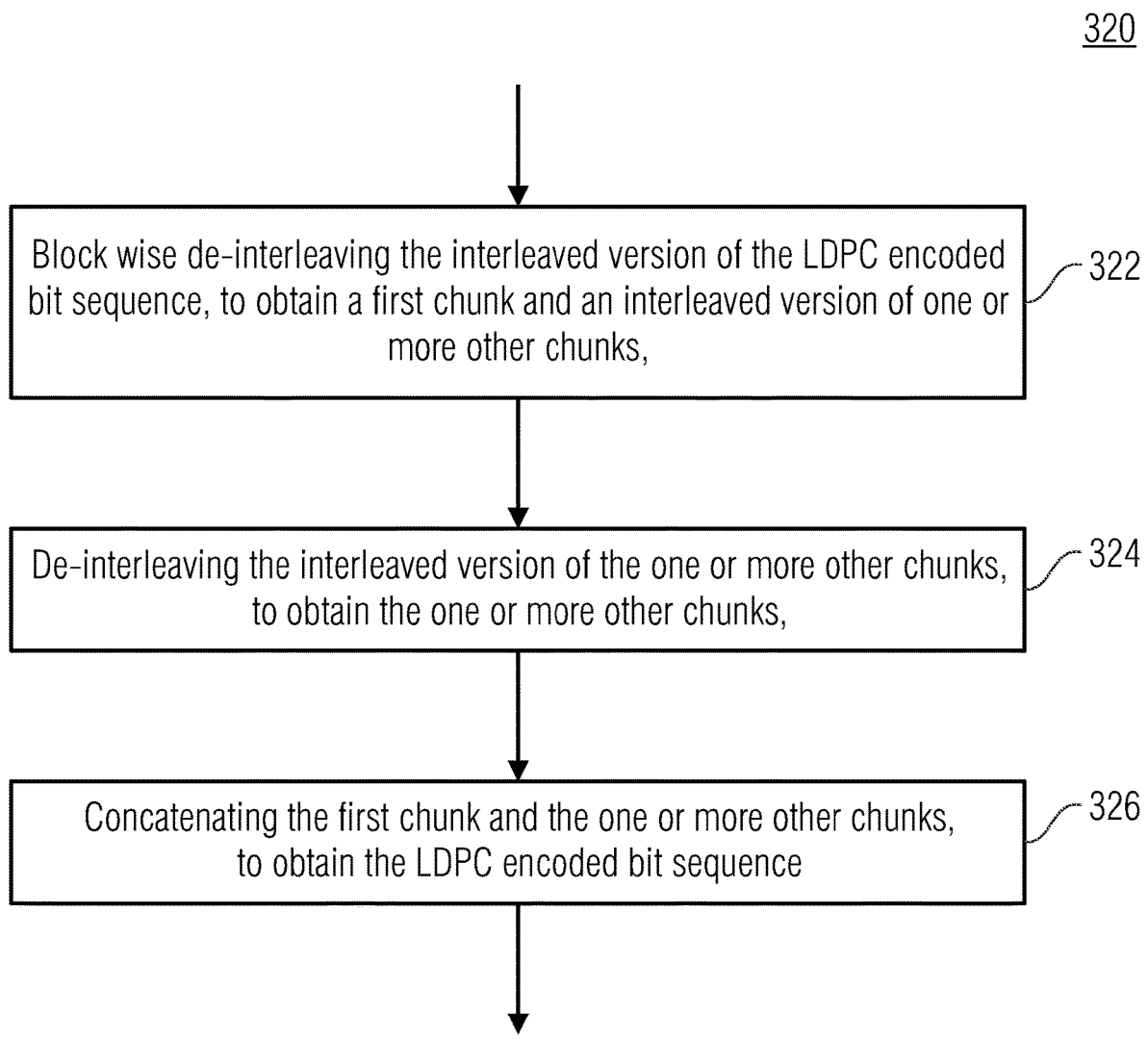
FIG. 16 shows a flowchart of a method for de-interleaving an interleaved version of an LDPC encoded bit sequence, according to an embodiment of the present invention.

FIG. 16 shows a flowchart of a method 320 for de-interleaving an interleaved version of an LDPC encoded bit sequence, according to an embodiment of the present invention. The method 320 comprises a step 322 of block-wise de-interleaving the interleaved version of the LDPC encoded bit sequence, to obtain a first chunk and an interleaved version of one or more other chunks, wherein the first chunk of the plurality of chunks consists of bits of a first type, wherein the bits of the first type
- are error correcting bits of the LDPC encoded bit sequence,
- are repeat accumulate bits of the LDPC encoded bit sequence, and/or
- are represented, in a Tanner graph representation of the LDPC encoded bit sequence, by variable nodes that comprise non-random connections to at least two error correcting check nodes.

Further, the method 320 comprises a step 324 of de-interleaving the interleaved version of the one or more other chunks, to obtain the one or more other chunks. Further, the method 320 comprises a step 326 of concatenating the first chunk and the one or more other chunks, to obtain the LDPC encoded bit sequence.

Subsequently, further embodiments of the present invention are described, which can be implemented individually or in combination with any of the embodiments described in this patent application.

Embodiments provide a hybrid interleaver for LDPC codes that exhibit a staircase node distribution, such as the codes proposed for the upcoming IEEE 802.15.4w [1], and the codes adopted in the DVB-NGH standard. The interleaver makes it possible to provide additional pilot symbols to the channel estimator in order to provide a Decision Directed Channel Estimation (DDCE) approach [2]. The interleaver breaks the LDPC codeword into N_chunks chunks. It starts with the chunk that flags the start of the staircase structure. This staircase chunk is distributed over the hops in a block-wise fashion. After that, the remaining $N_{chunks}-1$ chunks are randomly interleaved and mounted on the hops following the block-wise interleaved staircase bits. The essence of the hybrid block-wise random interleaver according to embodiments lies in the viability of the newly structured LDPC codeword to trigger the Belief Propagation (BP) decoding algorithm even when a limited number of estimated fading coefficients is present. This means that, the LDPC decoder would still be capable of decoding some bits. These bits would serve as extra pilot symbols that could be fed back to the channel estimator along with the original preamble sequence. This in return would allow for the detection of additional fading coefficients that would be fed back to the LDPC decoder. The process of traversing information back and forth between the LDPC decoder and the Decision Directed Channel Estimator would continue till the full LDPC codeword is decoded.

Embodiments restructure the Tanner graph of LDPC codes with code rate $r \leq 1/2$, that exhibit a staircase structure.

Embodiments resort the LDPC codeword in a way that maximizes its decoding capability (e.g., even with a limited number of estimated fading coefficients).

Embodiments sort out the LDPC bits such that the initially estimated fading coefficients would meet the minimum triggering threshold of the LDPC decoder.

Embodiments increase the probability of having check nodes that have only one erased LLR received from their corresponding variable nodes.

Embodiments break down the staircase structure of the encoded codeword. Embodiments distribute the non-staircase systematic information bits over the hops. Embodiments indirectly scramble the first estimated fading coefficients across the codeword (e.g., rather than stacking them in one chunk).

Embodiments allow the viability of the Belief Propagation decoding algorithm of LDPC with limited number of estimated fading coefficients.

Embodiments assign the LDPC decoded bits to serve as extra pilot symbols that could be fed back to the channel estimator along with the original preamble sequence.

Embodiments allow the detection of additional fading coefficients that would be fed back to the LDPC decoder.

Embodiments traverse information back and forth between the LDPC decoder and the decision directed channel estimator Embodiments promote enhanced channel estimation with a relatively short preamble sequence.

Embodiments omit the urge to send a long non-data preamble sequence to guarantee a certain reliability threshold.

Embodiments relatively enhance the effective data rate in comparison to the conventional pilot-aided channel estimation if the same reliability level is to be met.

Embodiments alternatively afford higher level of robustness in comparison to the conventional pilot-aided channel estimation if the same preamble size is assumed.

In embodiments, the interleaver (e.g., hybrid block-wise random interleaver) involves four stages (or blocks): (1) segmentation, (2) concatenation, (3) pseudorandom interleaving, and (4) block-wise interleaving.

In embodiments, the segmentation block takes in the input codeword v of length n bits, and outputs $N_{chunks}$ chunks, $Ch_i \forall i=0, \ldots, N_{chunks}-1$, where $N_{chunks}=1/r$, and $r=k/n$ is the code rate, wherein each chunk has $N_{bits/chunk}=n/N_{chunks}$ bits taken serially from v, wherein each chunk $Ch_i$, is given by:

$$Ch_i(j) = v(j + iN_{bits/chunk}) \forall i = 0, \ldots, N_{chunks}-1, j = 0, \ldots, N_{bits/chunk}-1 \quad (1)$$

In embodiments, the concatenator will take in $Ch_i, \forall i = 0, \ldots, N_{chunks}-1, i \neq 1$, and concatenate them into one composite vector $Ch_{0 \to N_{chunks}-1 \backslash 1}$ of length $(N_{chunks}-1) \times N_{bits/chunk}$, wherein the concatenated vector is given by:

$$Ch_{0 \to N_{chunks}-1 \backslash 1}(j + \max(i-1, 0) \times N_{bits/chunk}) = Ch_i(j)$$

$$\forall i = 0, \ldots, N_{chunks}-1, i \neq 1, j = 0, \ldots, N_{bits/chunk}-1, \quad (2)$$

In embodiments, the random interleaver takes in both the permutation vector $\pi$ generated by the LFSR, and the concatenated vector $Ch_{0 \to N_{chunks}-1 \backslash 1}$, wherein the random interleaver produces an interleaved vector $$\widetilde{Ch}_{0 \to N_{chunks}-1 \backslash 1},$$

wherein the mapping of elements from $Ch_{0 \to N_{chunks}-1 \backslash 1}$ to $$\widetilde{Ch}_{0 \to N_{chunks}-1 \backslash 1}$$

is done according to the permutation indices in $\pi$ such that:

$$\widetilde{Ch}_{0 \to N_{chunks}-1 \backslash 1}(j) = Ch_{0 \to N_{chunks}-1 \backslash 1}(\pi(j)) \forall j = 0, \ldots, L-1, \quad (4)$$

where $L = (N_{chunks}-1) \times N_{bits/chunk}$, is the length of the concatenated vector.

In embodiments, both $Ch_1$ and $$\widetilde{Ch}_{0 \to N_{chunks}-1 \backslash 1}$$

are fed to the block-wise interleaver producing an output vector $\tilde{v}$, that corresponds to the interleaved version of the LDPC coded vector v. The interleaver loops over the $N_{hops}$ assigning $N_{bits/hop}$ bits for each hop. It first starts by mapping $N_{bits/round}^{(1)}=2$ bits, from $Ch_1$ onto each hop over $N_{rounds}^{(1)}$ rounds. This can be represented by:

$$\tilde{v}(j + i \times N_{bits/hop} + k \times N_{bits/round}^{(1)}) = Ch_1(j + i \times N_{bits/round}^{(1)} + k \times N_{hops} \times N_{bits/round}^{(1)}), \quad (5)$$

where $N_{hops}$ is the number of hops, $N_{bits/hop} = n/N_{hops}$, is the number of transmitted bits over each hop, $N_{bits/round}^{(1)} = 2$, is the number of bits mapped from $Ch_1$ on each hop every round, $N_{rounds}^{(1)}$ is the total number of rounds that may be used to exhaust all the bits of $Ch_1$, i=0, ..., $N_{hops}-1$, is the hop index,
j=0, ..., $N_{bits/round}^{(1)}-1$, is the bit index within the round, and
k=0, ..., $N_{rounds}^{(1)}-1$, is the round index In embodiments, after $N_{rounds}^{(1)}$, each hop will have $N_{rounds}^{(1)} \times N_{bits/round}^{(1)}$ bits from $Ch_1$. The rest of the $N_{bits/hop}$ bits on each hop should be taken from $$\widetilde{Ch}_{0 \to N_{chunks}-1 \backslash 1}$$

over one round. This means that, for each hop $N_{bits/round}^{(0 \to N_{chunks}-1 \backslash 1)} = (N_{chunks}-1) \times N_{bits/chunk/hop}$ bits should be taken serially from $$\widetilde{Ch}_{0 \to N_{chunks}-1 \backslash 1}.$$

This can be described by:

$$\tilde{v}(j + i \times N_{bits/hop} + N_{bits/chunk/hop}) = \qquad (6)$$
$$\widetilde{Ch}_{0 \to N_{chunks}-1 \backslash 1}\left(j + i \times N_{bits/round}^{(0 \to N_{chunks}-1 \backslash 1)}\right),$$

where, $N_{bits/chunk/hop} = N_{bits/chunk}/N_{hops}$, is approximately the number of transmitted bits from every chunk over each hop, $N_{bits/round}^{(0 \to N_{chunks}-1 \backslash 1)} = (N_{chunks}-1) \times N_{bits/chunk/hop}$, is the number of bits mapped from $$\widetilde{Ch}_{0 \to N_{chunks}-1 \backslash 1}$$

on each hop, i=0, ..., $N_{hops}-1$, is the hop index, and
j=0, ..., $N_{bits/round}^{(0 \to N_{chunks}-1 \backslash 1)}-1$, is the bit index within $$\widetilde{Ch}_{0 \to N_{chunks}-1 \backslash 1}.$$

Further embodiments provide an interleaver for interleaving an LDPC encoded bit sequence, to obtain an interleaved version of the LDPC encoded bit sequence, wherein the interleaver is configured to interleave the LDPC encoded bit sequence based on the following syntax (e.g., by performing (e.g., running) the following pseudocode):

```
Input: v, r, n, N_hops, N_bits/round^(1), π
N_chunks = 1/r
N_bits/chunk = n/N_chunks
N_bits/hop = n/N_hops
N_rounds^(1) = n/(N_chunks × N_hops × N_bits/round^(1))
N_bits/chunk/hop = N_bits/chunk/N_hops
N_bits/round^(0→N_chunks-1\1) = (N_chunks - 1) × N_bits/chunk/hop
%_____Segmentation_____%
for i = 0: N_chunks - 1
    for j = 0: N_bits/chunk - 1
        Ch_i(j) = v(j + iN_bits/chunk)
    end
end
%_____Concatenation_____%
k = 0
for i = 0: N_chunks - 1
    if (i == 1)
        continue
    end
    for j = 0: N_bits/chunk - 1
        Ch_{0→N_chunks-1\1}(j + kN_bits/chunk) = Ch_i(j)
    end
    k = k + 1
end
%_____Random Interleaver_____%
for j = 0: ((N_chunks - 1)N_bits/chunk) - 1
    C̃h_{0→N_chunks-1\1}(j) = Ch_{0→N_chunks-1\1}(π(j))
end
%_____Block Interleaver_____%
for i = 0: N_hops - 1
    for j = 0: N_bits/round^(1) - 1
        for k = 0: N_rounds^(1) - 1
            ṽ(j + iN_bits/hop + kN_bits/round^(1)) = Ch_1(j + iN_bits/round^(1) + kN_hops N_bits/round^(1))
        end
    end
    for j = 0: N_bits/round^(0→N_chunks-1\1) - 1
        ṽ(j + iN_bits/hop + N_bits/chunk/hop) = C̃h_{0→N_chunks-1\1}(j + iN_bits/round^(0→N_chunks-1\1))
    end
end
Output: ṽ
``` wherein i represents a control variable, wherein j represents a control variable, wherein n represents a number of bits (e.g., information bits+redundancy bits) of the LDPC encoded bit sequence, wherein k represents a control variable, wherein r represents the code rate, wherein $N_{chunks}$ represents a number of chunks the LDPC encoded bit sequence is segmented into, wherein $N_{hops}$ represents a number of sub-data packets over which the interleaved version of the LDPC encoded bit sequence is distributed, wherein $N_{rounds}^{(1)}$ represents a number of rounds that may be used to distribute the bits of the first chunk, wherein $N_{bits/round}^{(1)}$ represents a number of bits per round which are taken from the first chunk and distributed over the plurality of sub-data packets, wherein $N_{bits/hop}$ represents a number of bits per sub-data packet, wherein $N_{bits/chunk}$ represents a number of bits per chunk, wherein $N_{bits/chunk/hop}$ represents a number of bits per chunk per hop, wherein v represents the LDPC encoded bit sequence, wherein $\tilde{v}$ represents the interleaved version of the LDPC encoded bit sequence, wherein $Ch_i$ represents each of the plurality of chunks, wherein $Ch_1$ represents the first chunk, wherein $$\widetilde{Ch}_{0 \to N_{chunks}-1\backslash 1}$$

represents the interleaved bit sequence (e.g., an interleaved version of (a concatenated version) of the one or more other chunks).

Channel estimation is a crucial factor for the successful decoding of LDPC codewords. In order to provide sufficient estimation of the channel, a long preamble sequence is useful. This in return diminishes the effective data rate. If on the other hand, a short preamble is inserted, the LDPC decoder would lack the adequate number of estimated fading coefficients. As a result, the LDPC decoder would treat the symbols that correspond to the non-estimated coefficients as erasures. Consequently, this would render the triggering of the LDPC decoder impossible.

Embodiments provide a hybrid interleaver that aims at solving the dilemma of the rate-reliability tradeoff. The hybrid interleaver tackles the LDPC codes that exhibit a staircase node structure, such as the codes proposed for the upcoming IEEE 802.15.4w, and the codes adopted in the DVB-NGH standard. It targets the restructuring of the LDPC codeword in a way that maximizes its decoding capability even with the limited estimated fading coefficients. The interleaver breaks the LDPC codeword into $N_{chunks}$ chunks. It starts with the chunk that flags the start of the staircase structure. This staircase chunk is distributed over the hops in a block-wise fashion. After that, the remaining ($N_{chunks}-1$) chunks are pseudo-randomly interleaved and mounted on the hops following the block-wise interleaved staircase bits.

The essence of the hybrid block-wise random interleaver according to embodiments lies in the viability of the newly structured LDPC codeword to trigger the BP decoding algorithm even when a limited number of estimated fading coefficients is present. This means that, the LDPC decoder would still be capable of decoding some bits. These bits would serve as extra pilot symbols that could be fed back to the channel estimator along with the original preamble sequence. This in return would allow for the detection of additional fading coefficients that would be fed back to the LDPC decoder. The process of traversing information back and forth between the LDPC decoder and the Decision Directed Channel Estimator would continue till the full LDPC codeword is decoded.

Further embodiments provide an interleaver (100) for interleaving an LDPC encoded codeword, the LDPC encoded codeword comprising a bit sequence z (102) of 736 FEC encoded bits (FEC=forward error correction).

The sequence z of 736 FEC encoded bits of a single codeword (102) of the LDPC encoder shall be segmented into 4 equally sized chunks $C_i$:

$z = \{C_0, C_1, C_2, C_3\} = \{z_0, z_1, z_2, \ldots, z_{735}\}$,
$C_i = \{z_{i \cdot 184}, z_{i \cdot 184+1}, z_{i \cdot 184+2}, \ldots, z_{(i+1) \cdot 184-}\}$.

The second chunk $C_1$ (110_1) [e.g., the chunk number two of the sequence of four chunks 110_0 to 110_3 designated as first chunk 110_1 herein (compare, e.g., with FIG. 2)] shall be removed from the sequence. The remaining sequence y (111) [e.g., (the concatenated version of) the three other chunks 110_0, 110_2 and 110_3, i.e., the chunk number one, the chunk number three and the chunk number four (compare, e.g., with FIG. 2)] is given by:

$$y = \{C_0, C_2, C_3\} = \{y_0, y_1, y_2, \ldots, y_{551}\}.$$

Figure 17:
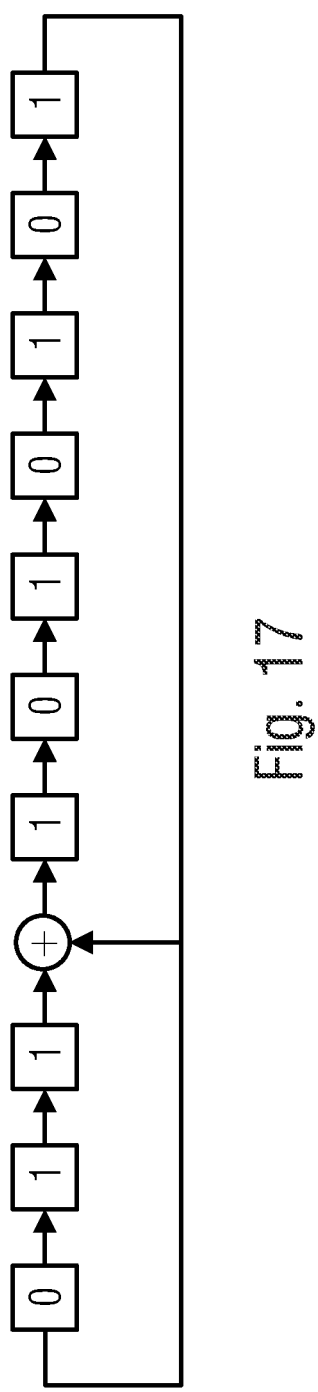
FIG. 17 shows a schematic block diagram of a 10-bit Galois linear feedback shift register (LFSR) in an initial state.

The sequence y (111) shall be pseudo randomly scrambled using the scramble vector u, which is derived from the pseudo random sequence v, generated by the 10-bit Galois LFSR with generator polynomial $g(x) = x^{10} + x^7 + 1$. The initial value of the LFSR shift register (107) at iteration 0 shall be $v_0 = 469$, with the feedback output of the LFSR (107) representing the least significant bit. The LFSR (107) in its initial state at iteration 0 is show in FIG. 17.

The value at iteration $v_{i+1}$ is derived by iterating the shift register again. If the value of this iteration of the LFSR exceeds 552 the value is skipped and the LFSR is iterated again until the value is does not exceed 552. This value is then assigned to $v_{i+1}$.

An example of the first values of v is given in Table 1:

TABLE 1

Example of scramble vector generation.

| LFSR Iteration | LFSR Value Int | LFSR Value Bit | Valid | Assigned to v |
|---|---|---|---|---|
| 0 | 469 | 01 1101 0101 | Yes | $v_0$ |
| 1 | 682 | 10 1010 1010 | No | — |
| 2 | 341 | 01 0101 0101 | Yes | $v_1$ |
| 3 | 746 | 10 1110 1010 | No | — |
| 4 | 373 | 01 0111 0101 | Yes | $v_2$ |
| 5 | ... | ... | ... | ... |

The vector u is given by $u_i = v_i - 1$ and the scrambled version of y, y' (112) [e.g., the interleaved bit sequence 112] is given by:

$$y' = \{y_{u_0}, y_{u_1}, \ldots, y_{u_{N_{FEC} \cdot (1-R)-1}}\}$$

The second chunk $C_1$ (110_1) shall be distributed over the L radio-bursts [e.g., sub-data packets] by assigning every bit $c_n$ of the chunk, a radio-burst index l and a position i within the radio-burst dependent on the index n.

$$l(n) = \left\lfloor \frac{n}{2} \right\rfloor \bmod 23,$$

$$i(n) = 2 \cdot \left\lfloor \frac{n}{46} \right\rfloor + (n \bmod 2),$$

with $n \in \{0,1,2 \ldots 183\}$, where $n=0$ refers to the first bit $c_0$ of $C_1$.

The bits of y' (112) [e.g., the interleaved bit sequence 112] shall be assigned a radio-burst index 1 and a position i dependent on the index m as follows:

$$l(m) = \left\lfloor \frac{m}{24} \right\rfloor,$$
$$i(m) = 8 + (m \bmod 24),$$

with $m \in \{0,1,2 \ldots 551\}$, where $m=0$ refers to the first bit $y'_0$ of y'.

In both cases i=0 refers to the first bit of the radio-burst payload. If multiple codewords are transmitted, i=0 for the next codeword refers to the first bit after the already placed bits.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

Depending on certain implementation requirements, embodiments of the invention can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The methods described herein may be performed using a hardware apparatus, or using a computer, or using a combination of a hardware apparatus and a computer.

The methods described herein, or any components of the apparatus described herein, may be performed at least partially by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] IEEE P802.15.4w Low Power Wide Area
[2] DE 10 2018 206 132
[3] S. Kobayashi, N. Loghin, R. Ikegaya, "proposal-of-ldpc-low-density-parity-code-for-lpwa", 15-18-0289-01-004w

The invention claimed is:
1. An interleaver for interleaving an LDPC encoded bit sequence, wherein the interleaver comprises:

a segmentation stage configured to segment the LDPC encoded bit sequence into a plurality of chunks, the plurality of chunks comprising a first chunk and one or more other chunks, a first interleaver stage, configured to interleave the one or more other chunks or a concatenated version thereof, a second interleaver stage, configured to block wise interleave the first chunk of the plurality of chunks and an interleaved bit sequence provided by the first interleaver stage, to acquire an interleaved version of the LDPC encoded bit sequence, wherein the first chunk of the plurality of chunks comprises bits of a first type, wherein the bits of the first type are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes.

2. The interleaver according to claim 1,
wherein the first chunk bypasses the first interleaver stage.

3. The interleaver according to claim 1,
wherein one chunk of the one or more other chunks comprises bits of a second type, wherein the bits of the second type
are information bits of the LDPC encoded bit sequence, and/or
are represented, in a Tanner graph representation of the LDPC encoded bit sequence, by variable nodes that comprise pseudo random connections to error correcting check nodes.

4. The interleaver according to claim 3,
wherein the one or more other chunks are two or more other chunks,
wherein another chunk of the two or more other chunks comprises bits of the first type.

5. The interleaver according to claim 1,
wherein the first interleaver stage is a pseudorandom interleaver.

6. The interleaver according to claim 5,
wherein the pseudorandom interleaver is based on a linear shift register.

7. The interleaver according to claim 5,
wherein the pseudorandom interleaver is a block wise interleaver.

8. The interleaver according to claim 1,
wherein the first interleaver stage is configured to interleave the one or more other chunks or a concatenated version thereof based on the following syntax:

for $j = 0: ((N_{chunks} - 1)N_{bits/chunk}) - 1$ $\widetilde{Ch}_{0 \to N_{chunks}-1 \backslash 1}(j) = Ch_{0 \to N_{chunks}-1 \backslash 1}(\pi(j))$ end wherein j represents a control variable, wherein $N_{chunks}$ represents the number of the plurality of chunks the LDPC encoded bit sequence is segmented into, wherein $N_{bits/chunk}$ represents the number of bits per chunk, wherein $\widetilde{Ch}_{0 \to N_{chunks}-1 \backslash 1}$ represents the interleaved bit sequence, wherein $Ch_{0 \to N_{chunks}-1 \backslash 1}$ represents a concatenated version of the one or more other chunks, wherein $\pi$ represents a permutation indices vector of a linear feedback shift register.

9. The interleaver according to claim 1,
wherein the second interleaver stage is a block wise interleaver.

10. The interleaver according to claim 1,
wherein the second interleaver stage is configured to distribute the interleaved version of the LDPC encoded bit sequence over a plurality of sub-data packets.

11. The interleaver according to claim 10,
wherein the second interleaver stage is configured to distribute block wise bits of the first chunk of the plurality of chunks over the plurality of sub-data packets in at least two rounds.

12. The interleaver according to claim 10,
wherein the second interleaver stage is configured to evenly distribute block wise bits of the interleaved bit sequence provided by the first interleaver stage over the plurality of sub-data packets.

13. The interleaver according to claim 1,
wherein the second interleaver stage is configured to interleave the first chunk and the interleaved bit sequence provided by the first interleaver stage based on the following syntax:

```
for i = 0: N_hops - 1
    for j = 0: N_bits/round^(1) - 1
        for k = 0: N_rounds^(1) - 1
            ṽ(j + iN_bits/hop + kN_bits/round^(1)) = Ch_1(j + iN_bits/round^(1) + kN_hops N_bits/round^(1))
        end
    end
    for j = 0: N_bits/round^(0→N_chunks-1\1) - 1
        ṽ(j + iN_bits/hop + N_bits/chunk/hop) = C̃h_{0→N_chunks-1\1}(j + iN_bits/round^(0→N_chunks-1\1))
    end
end
Output: ṽ
``` wherein i represents a control variable, wherein j represents a control variable, wherein k represents a control variable, wherein $N_{chunks}$ represents a number of chunks the LDPC encoded bit sequence is segmented into, wherein $N_{hops}$ represents a number of sub-data packets over which the interleaved version of the LDPC encoded bit sequence is distributed, wherein $N_{bits/round}^{(1)}$ represents a number of bits per round which are taken from the first chunk and are distributed over the plurality of sub-data packets, wherein $N_{bits/hop}$ represents a number of bits per sub-data packet, wherein i represents the interleaved version of the LDPC encoded bit sequence, wherein $Ch_1$ represents the first chunk, wherein $$\widetilde{Ch}_{0 \to N_{chunks}-1 \backslash 1}$$

represents the interleaved bit sequence.

14. The interleaver according to claim 1, wherein a number of the plurality of chunks into which the LDPC encoded bit sequence is segmented is equal to one divided by the code rate of the LDPC encoded bit sequence.

15. The interleaver according to claim 1, wherein the segmentation stage is configured to segment the LDPC encoded bit sequence into the plurality of chunks based on the following syntax:

```
for i = 0: N_chunks − 1
   for j = 0: N_bits/chunk − 1
      Ch_i(j) = v(j + iN_bits/chunk)
   end
end
``` wherein i represents a control variable, wherein j represents a control variable, wherein $N_{chunks}$ represents a number of chunks the LDPC encoded bit sequence is segmented into, wherein $N_{bits/chunk}$ represents the number of bits per chunk, wherein $Ch_i$ represents each of the plurality of chunks, and wherein v represents the LDPC encoded bit sequence.

16. The interleaver according to claim 1, wherein the one or more other chunks are two or more other chunks, wherein the first interleaver stage is configured to interleave a concatenated version of the two or more other chunks.

17. The interleaver according to claim 16, wherein the interleaver comprises a concatenation stage configured to concatenate the two or more other chunks, to acquire the concatenated version of the two or more other chunks.

18. The interleaver according to claim 17, wherein the concatenation stage is configured to concatenate the one or more other chunks of the plurality of chunks based on the following syntax:

```
k = 0
for i = 0: N_chunks − 1
   if
      continue
   end
   for j = 0: N_bits/chunk − 1
      Ch_{0→N_chunks−1\1}(j + kN_bits/chunk) = Ch_i(j)
   end
   k = k + 1
end
``` wherein k represents a control variable, wherein i represents a control variable, wherein j represents a control variable, wherein $N_{bits/chunk}$ represents a number of bits per chunk, wherein $Ch_{0 \to N_{chunks}-1 \backslash 1}$ represents a concatenated version of the one or more other chunks, wherein $Ch_i$ represents each of the plurality of chunks.

19. A de-interleaver for de-interleaving an interleaved version of an LDPC encoded bit sequence, wherein the de-interleaver comprises:

a first de-interleaver stage, configured to block wise de-interleave the interleaved version of the LDPC encoded bit sequence, to acquire a first chunk and an interleaved bit sequence, a second de-interleaver stage, configured to de-interleave the interleaved bit sequence, to acquire the one or more other chunks, a concatenation stage, configured to concatenate the first chunk and the one or more other chunks, to acquire the LDPC encoded bit sequence, wherein the first chunk of the plurality of chunks comprises bits of a first type, wherein the bits of the first type are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes.

20. The de-interleaver according to claim 19, wherein the first chunk bypasses the second de-interleaver stage.

21. The de-interleaver according to claim 19, wherein one chunk of the one or more other chunks comprises bits of a second type, wherein the bits of the second type are information bits of the LDPC encoded bit sequence, and/or are represented, in a Tanner graph representation of the LDPC encoded bit sequence, by variable nodes that comprise pseudo random connections to error correcting check nodes.

22. The de-interleaver according to claim 21, wherein the one or more other chunks are two or more other chunks, wherein another chunk of the two or more other chunks comprises bits of the first type.

23. The de-interleaver according to claim 19, wherein the first de-interleaver stage is a block-wise de-interleaver.

24. The de-interleaver according to claim 19, wherein the second de-interleaver stage is a pseudorandom de-interleaver.

25. The de-interleaver according to claim 24, wherein the pseudorandom de-interleaver is based on a linear shift register.

26. The de-interleaver according to claim 24, wherein the pseudorandom de-interleaver is a block wise de-interleaver.

27. The de-interleaver according to claim 19, wherein the interleaved bit sequence is an interleaved version of a concatenated version of two or more other chunks, wherein the second de-interleaver stage is configured to de-interleave the interleaved version of the concatenated version of the two or more other chunks.

28. A receiver, comprising:

a receiving unit, configured to receive a plurality of sub-data packets that are transmitted non-concurrently from a transmitter to the receiver, a de-interleaver according to claim 19, wherein the de-interleaver is configured to iteratively de-interleave, using channel state information describing a channel between the transmitter and the receiver, a faded version of the LDPC encoded bit sequence transmitted with the plurality of sub-data packets, and an iterative decoder, configured to iteratively decode the LDPC encoded bit sequence iteratively provided by the de-interleaver, wherein the channel state information is iteratively updated based on a decoded bit sequence provided by the iterative decoder.

29. A method for interleaving an LDPC encoded bit sequence, wherein the method comprises:

segmenting the LDPC encoded bit sequence into a plurality of chunks, the plurality of chunks comprising a first chunk and one or more other chunks, interleaving the one or more other chunks or a concatenated version thereof, to acquire an interleaved bit sequence, block wise interleaving the first chunk of the plurality of chunks and the interleaved bit sequence, to acquire an interleaved version of the LDPC encoded bit sequence, wherein the first chunk of the plurality of chunks comprises bits of a first type, wherein the bits of the first type are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes.

30. A method for de-interleaving an interleaved version of an LDPC encoded bit sequence, wherein the method comprises:

block wise de-interleaving the interleaved version of the LDPC encoded bit sequence, to acquire a first chunk and an interleaved version of one or more other chunks, de-interleaving the interleaved version of the one or more other chunks, to acquire the one or more other chunks, concatenating the first chunk and the one or more other chunks, to acquire the LDPC encoded bit sequence, wherein the first chunk of the plurality of chunks comprises bits of a first type, wherein the bits of the first type are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes.

31. A non-transitory digital storage medium having a computer program stored thereon to perform the method for interleaving an LDPC encoded bit sequence, wherein the method comprises:

segmenting the LDPC encoded bit sequence into a plurality of chunks, the plurality of chunks comprising a first chunk and one or more other chunks, interleaving the one or more other chunks or a concatenated version thereof, to acquire an interleaved bit sequence, block wise interleaving the first chunk of the plurality of chunks and the interleaved bit sequence, to acquire an interleaved version of the LDPC encoded bit sequence, wherein the first chunk of the plurality of chunks comprises bits of a first type, wherein the bits of the first type are error correcting bits of the LDPC encoded bit sequence, are repeat accumulate bits of the LDPC encoded bit sequence, and/or are represented, in a Tanner graph representation of the LDPC encoded bit sequence, by variable nodes that are connected respectively to at least two consecutive error correcting check nodes, when said computer program is run by a computer.

* * * * *